(12) United States Patent
Yamazaki et al.

(10) Patent No.: US 8,847,326 B2
(45) Date of Patent: Sep. 30, 2014

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Kiyoshi Kato, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/913,591

(22) Filed: Jun. 10, 2013

(65) Prior Publication Data

US 2013/0341615 A1    Dec. 26, 2013

Related U.S. Application Data

(63) Continuation of application No. 13/175,542, filed on Jul. 1, 2011, now Pat. No. 8,461,586.

(30) Foreign Application Priority Data

Jul. 16, 2010   (JP) .................................. 2010-162184

(51) Int. Cl.
*H01L 27/088*    (2006.01)
*H01L 27/108*    (2006.01)
*H01L 27/115*    (2006.01)
*H01L 27/12*     (2006.01)
*G11C 16/04*     (2006.01)
*G11C 16/26*     (2006.01)

(52) U.S. Cl.
CPC ........ *H01L 27/088* (2013.01); *H01L 27/11517* (2013.01); *G11C 16/0433* (2013.01); *H01L 27/1225* (2013.01); *H01L 27/1156* (2013.01); *H01L 27/1211* (2013.01); *G11C 16/26* (2013.01)
USPC ....... 257/392; 257/43; 257/401; 257/E29.275

(58) Field of Classification Search
None
See application file for complete search history.

(56) References Cited

U.S. PATENT DOCUMENTS 4,466,081 A    8/1984  Masuoka
4,630,089 A    12/1986 Sasaki et al.
(Continued)

FOREIGN PATENT DOCUMENTS

CN       101057329 A    10/2007
EP       1 737 044 A1   12/2006
(Continued)

OTHER PUBLICATIONS

International Search Report, PCT Application No. PCT/JP2011/064856, dated Sep. 13, 2011, 4 pages.
(Continued)

*Primary Examiner* — Thomas L Dickey
*Assistant Examiner* — Joseph Schoenholtz
(74) *Attorney, Agent, or Firm* — Fish & Richardson P.C.

(57) ABSTRACT

A semiconductor device with a novel structure in which stored data can be retained even when power is not supplied, and does not have a limitation on the number of write cycles. The semiconductor device includes a memory cell including a first transistor, a second transistor, and an insulating layer placed between a source region or a drain region of the first transistor and a channel formation region of the second transistor. The first transistor and the second transistor are provided to at least partly overlap with each other. The insulating layer and a gate insulating layer of the second transistor satisfy the following formula: $(t_a/t_b) \times (\varepsilon_{ra}/\varepsilon_{rb}) < 0.1$, where $t_a$ represents the thickness of the gate insulating layer, $t_b$ represents the thickness of the insulating layer, $\varepsilon_{ra}$ represents the dielectric constant of the gate insulating layer, and $\varepsilon_{rb}$ represents the dielectric constant of the insulating layer.

21 Claims, 10 Drawing Sheets

(56) References Cited

U.S. PATENT DOCUMENTS

| | | |
|---|---|---|
| 5,006,913 A | 4/1991 | Sugahara et al. |
| 5,349,366 A | 9/1994 | Yamazaki et al. |
| 5,612,552 A | 3/1997 | Owens |
| 5,731,856 A | 3/1998 | Kim et al. |
| 5,744,864 A | 4/1998 | Cillessen et al. |
| 5,998,808 A | 12/1999 | Matsushita |
| 6,127,702 A | 10/2000 | Yamazaki et al. |
| 6,150,695 A | 11/2000 | Gardner et al. |
| 6,232,637 B1 | 5/2001 | Gardner et al. |
| 6,294,274 B1 | 9/2001 | Kawazoe et al. |
| 6,314,017 B1 | 11/2001 | Emori et al. |
| 6,320,228 B1 | 11/2001 | Yu |
| 6,358,828 B1 | 3/2002 | Kadosh et al. |
| 6,429,484 B1 | 8/2002 | Yu |
| 6,445,026 B1 | 9/2002 | Kubota et al. |
| 6,465,834 B1 | 10/2002 | Nakazato et al. |
| 6,536,013 B2 | 3/2003 | Kobayashi et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,250,680 B2 | 7/2007 | Gonzalez |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,741,644 B2 | 6/2010 | Lyu et al. |
| 7,833,847 B2 | 11/2010 | Kim et al. |
| 7,859,889 B2 | 12/2010 | Kameshiro et al. |
| 7,936,024 B2 | 5/2011 | Kim et al. |
| 8,008,137 B2 | 8/2011 | Wu et al. |
| 8,637,865 B2 * | 1/2014 | Kato ........................... 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0144979 A1 | 7/2004 | Bhattacharyya |
| 2004/0245577 A1 | 12/2004 | Bhattacharyya |
| 2005/0017302 A1 | 1/2005 | Hoffman |
| 2005/0128803 A1 | 6/2005 | Luk et al. |
| 2005/0199959 A1 | 9/2005 | Chiang et al. |
| 2006/0022241 A1 | 2/2006 | Shimojo et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215906 A1 | 9/2007 | Wu et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142888 A1 | 6/2009 | Tsuchiya |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0032668 A1 | 2/2010 | Yamazaki et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0101351 A1 | 5/2011 | Yamazaki |
| 2011/0121878 A1 | 5/2011 | Kato et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 * | 6/2011 | Yamazaki et al. ........... 365/149 |
| 2011/0210339 A1 | 9/2011 | Yamazaki et al. |
| 2014/0042511 A1 * | 2/2014 | Yamazaki et al. ........... 257/300 |

FOREIGN PATENT DOCUMENTS

| | | |
|---|---|---|
| EP | 1 835 535 A2 | 9/2007 |
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |

(56) References Cited

FOREIGN PATENT DOCUMENTS

| JP | 2000-150900 A | 5/2000 |
|---|---|---|
| JP | 2000-269358 A | 9/2000 |
| JP | 2001-053164 A | 2/2001 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-294897 A | 11/2007 |
| JP | 2010-062547 A | 3/2010 |
| WO | 00/55906 A1 | 9/2000 |
| WO | 2004/114391 A1 | 12/2004 |

OTHER PUBLICATIONS

Written Opinion, PCT Application No. PCT/JP2011/064856, dated Sep. 13, 2011, 4 pages.
Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.
Kim, W et al., "An Experimental High-Density DRAM Cell with a Built-in Gain Stage," IEEE Journal of Solid-State Circuits, Aug. 1, 1994, vol. 29, No. 8, pp. 978-981.
Shukuri, S et al., "A Complementary Gain Cell Technology for Sub-1 V Supply DRAMs," IEDM 92: Technical Digest of International Electron Devices Meeting, Dec. 13, 1992, pp. 1006-1008.
Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—0 TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li C et al "Modulated Structures of Homologous Compounds InMo3(ZnO)m (M=In, Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 7A-1
FIG. 7B
FIG. 7A-2
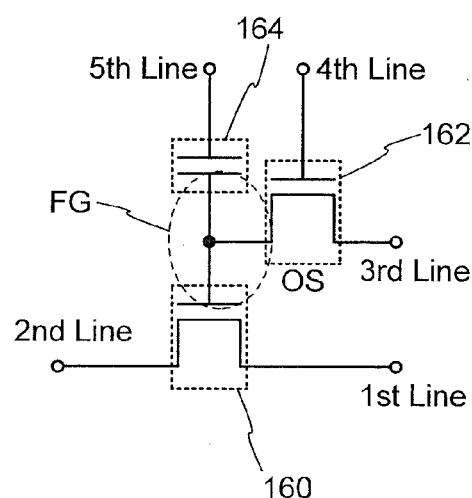
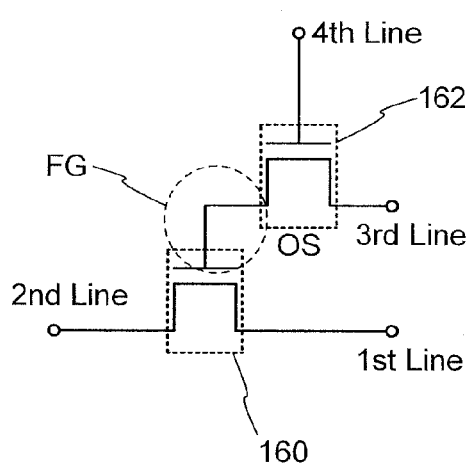
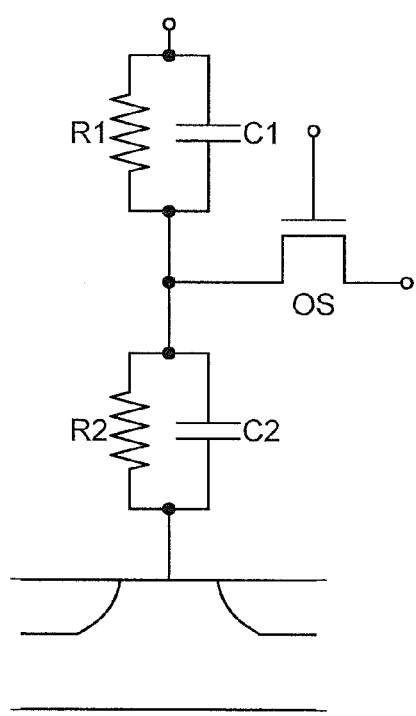

SEMICONDUCTOR DEVICE

CROSS-REFERENCE TO RELATED APPLICATIONS

This application is a continuation of U.S. application Ser. No. 13/175,542, filed Jul. 1, 2011, now allowed, which claims the benefit of a foreign priority application filed in Japan as Serial No. 2010-162184 on Jul. 16, 2010, both of which are incorporated by reference.

TECHNICAL FIELD

One embodiment of the present invention relates to a semiconductor device using a semiconductor element and a method for manufacturing the semiconductor device.

BACKGROUND ART

Storage devices using semiconductor elements are broadly classified into two categories: a volatile device that loses stored data when power supply stops, and a non-volatile device that retains stored data even when power is not supplied.

A typical example of a volatile storage device is a DRAM (dynamic random access memory). A DRAM stores data in such a manner that a transistor included in a storage element is selected and electric charge is stored in a capacitor.

When data is read from a DRAM, electric charge in a capacitor is lost on the above principle; thus, another write operation is necessary every time data is read out. Moreover, since a transistor included in a storage element has a leakage current between a source and a drain in an off state (i.e., an off-state current), electric charge flows into or out of a capacitor even if the transistor is not selected, whereby a data retention period is short. For that reason, another write operation (refresh operation) is necessary at predetermined intervals, and it is difficult to sufficiently reduce power consumption. Furthermore, since stored data is lost when power supply stops, an additional storage device using a magnetic material or an optical material is needed in order to hold data for a long time.

Another example of a volatile storage device is an SRAM (static random access memory). An SRAM retains stored data by using a circuit such as a flip-flop and thus does not need a refresh operation. This means that an SRAM has an advantage over a DRAM. However, cost per storage capacity is increased because of the use of a circuit such as a flip-flop. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding electric charge in the floating gate. Therefore, a flash memory has advantages in that the data retention time is extremely long (almost permanent) and a refresh operation which is necessary in a volatile storage device is not needed (e.g., see Patent Document 1).

However, a gate insulating layer included in a storage element deteriorates by tunneling current generated in writing, so that the storage element stops its function after a predetermined number of write operations. In order to reduce adverse effects of this problem, a method of equalizing the number of write operations for each storage element is employed, for example, in which case a complicated peripheral circuit is needed. Moreover, employing such a method does not solve the fundamental problem of lifetime. In other words, a flash memory is not suitable for applications in which data is frequently rewritten.

In addition, a flash memory needs high voltage for holding electric charge in the floating gate or removing the electric charge, and a circuit for generating high voltage is also necessary. Further, it takes a relatively long time to hold or remove electric charge, so that it is not easy to increase the speed of write and erase operations.

REFERENCE

Patent Document 1: Japanese Published Patent Application No. S57-105889

DISCLOSURE OF INVENTION

In view of the foregoing problems, an object of one embodiment of the present invention is to provide a semiconductor device with a novel structure in which stored data can be retained even when power is not supplied, and does not have a limitation on the number of write cycles. Another object is to increase the degree of integration of the semiconductor device with the novel structure.

According to one embodiment of the present invention, a semiconductor device is formed using an oxide semiconductor, specifically, a highly purified oxide semiconductor. A transistor formed using an oxide semiconductor has extremely low leakage current; therefore, data can be retained for a long time. Moreover, in the case of a transistor formed using a highly purified oxide semiconductor, the leakage current is remarkably low, and data can be therefore retained for an extremely long time.

Specifically, structures described below can be employed, for example.

According to one embodiment of the present invention, a semiconductor device includes a memory cell that includes a first transistor including a first channel formation region, a first gate insulating layer placed over the first channel formation region, a first gate electrode placed over the first gate insulating layer to overlap with the first channel formation region, and a source region and a drain region placed so that the first channel formation region is placed therebetween; a second transistor including a second channel formation region, a source electrode and a drain electrode electrically connected to the second channel formation region, a second gate electrode placed over the second channel formation region, and a second gate insulating layer placed between the second channel formation region and the second gate electrode; and an insulating layer placed between the second channel formation region and one of the source region and the drain region. The first transistor and the second transistor are provided to at least partly overlap with each other. The second gate insulating layer and the insulating layer satisfy Formula 1.

$$\frac{t_a}{t_b} \cdot \frac{\varepsilon_{rb}}{\varepsilon_{ra}} < 0.1 \qquad \text{[Formula 1]}$$

(In Formula 1, $t_a$ represents the thickness of the second gate insulating layer, $t_b$ represents the thickness of the insulating layer, $\varepsilon_{ra}$ represents the dielectric constant of the second gate insulating layer, and $\varepsilon_{rb}$ represents the dielectric constant of the insulating layer.)

According to another embodiment of the present invention, a semiconductor device includes a memory cell that includes a first transistor including a first channel formation region, a first gate insulating layer placed over the first channel formation region, a first gate electrode placed over the first gate insulating layer to overlap with the first channel formation region, and a source region and a drain region placed so that the first channel formation region is placed therebetween; a second transistor including a second channel formation region, a source electrode and a drain electrode electrically connected to the second channel formation region, a second gate electrode placed over the second channel formation region, and a second gate insulating layer placed between the second channel formation region and the second gate electrode; and an insulating layer placed between the second channel formation region and one of the source region and the drain region. The first transistor and the second transistor are provided to at least partly overlap with each other. The second gate insulating layer and the insulating layer satisfy Formula 2.

$$V_{th} - V_{max} \cdot \frac{t_a}{t_b} \cdot \frac{\varepsilon_{rb}}{\varepsilon_{ra}} > 0 \quad \text{[Formula 2]}$$

(In Formula 2, $t_a$ represents the thickness of the second gate insulating layer, $t_b$ represents the thickness of the insulating layer, $\varepsilon_{ra}$ represents the dielectric constant of the second gate insulating layer, $\varepsilon_{rb}$ represents the dielectric constant of the insulating layer, $V_{max}$ represents the potential of the source region or the drain region, and $V_{th}$ represents the threshold voltage of the second transistor.)

In the above structure, the first gate electrode is preferably electrically connected to the source electrode or the drain electrode. Further, in the above structure, a capacitor is preferably constituted by the source electrode or the drain electrode, the second gate insulating layer, and a conductive layer.

In the above structure, it is preferable that the first channel formation region and the second channel formation region include different semiconductor materials. In addition, in the above structure, the second channel formation region preferably includes an oxide semiconductor.

Note that although the transistor is formed using an oxide semiconductor material in the above semiconductor devices, one embodiment of the present invention is not limited to using an oxide semiconductor material. It is possible to use a material that can realize the off-current characteristics equivalent to those of the oxide semiconductor material, for example, a wide gap material such as silicon carbide (specifically, a semiconductor material with an energy gap Eg of greater than 3 eV).

Note that in this specification and the like, the terms "over" and "below" do not necessarily mean the positions "directly on" and "directly under". For example, the expression "a gate electrode over a gate insulating layer" does not exclude the case where a component is placed between the gate insulating layer and the gate electrode. Further, the terms "over" and "below" are used simply for convenience of explanation.

In this specification and the like, the terms "electrode" and "wiring" do not have functional limitations. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" can mean connection with an object having any electric function provided between components. There is no particular limitation on an object having any electric function as long as electric signals can be transmitted and received through it.

Examples of an "object having any electric function" are a switching element such as a transistor, a resistor, an inductor, a capacitor, and an element with a variety of functions as well as an electrode and a wiring.

Since the off-current of a transistor including an oxide semiconductor is extremely low, stored data can be retained for an extremely long time by using the transistor. In other words, power consumption can be adequately reduced because a refresh operation becomes unnecessary or the frequency of refresh operations can be extremely low. Moreover, stored data can be retained for a long time even when power is not supplied.

Further, the semiconductor device according to one embodiment of the present invention does not need high voltage for writing data, and degradation of the element does not become a problem. For example, since there is no need to perform injection of electrons to a floating gate and extraction of electrons from the floating gate which are needed in a conventional nonvolatile memory, deterioration of a gate insulating layer does not occur. That is, the semiconductor device according to one embodiment of the present invention does not have a limitation on the number of write cycles, which has been a problem of a conventional non-volatile memory, and thus has significantly improved reliability. Furthermore, data is written depending on the on state and the off state of the transistor, whereby high-speed operation can be easily realized. In addition, there is no need of operation for erasing data.

Since a transistor including a material other than an oxide semiconductor can operate at sufficiently high speed, a semiconductor device can operate (e.g., read data) at sufficiently high speed by using the transistor in combination with a transistor including an oxide semiconductor. Further, a transistor including a material other than an oxide semiconductor can realize a variety of circuits required to operate at high speed (e.g., a logic circuit and a driver circuit) in a favorable manner.

Thus, a semiconductor device having a novel feature can be achieved by including both the transistor including a semiconductor material which is not an oxide semiconductor (in a broader sense, a transistor capable of operating at a sufficiently high speed) and the transistor including an oxide semiconductor (in a broader sense, a transistor whose off-state current is sufficiently low).

BRIEF DESCRIPTION OF DRAWINGS

In the accompanying drawings.

FIGS. 7A-1, 7A-2, and 7B are circuit diagrams of semiconductor devices;

BEST MODE FOR CARRYING OUT THE INVENTION

Figure 1A:
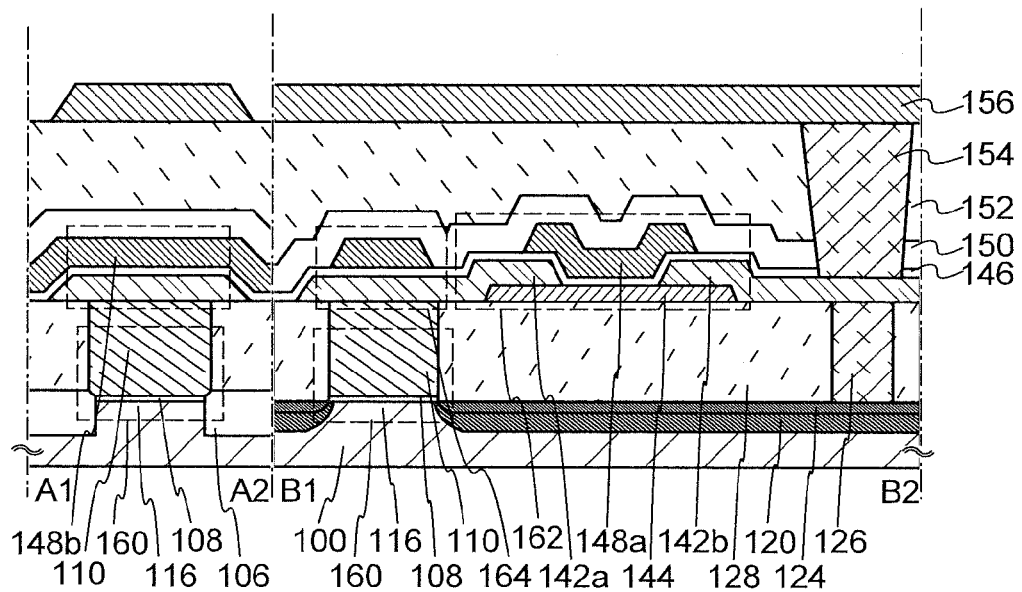
FIGS. 1A and 1B are a cross-sectional view and a plan view of a semiconductor device.

Examples of embodiments of the present invention will be described below with reference to the accompanying drawings. Note that the present invention is not limited to the following description and it will be readily appreciated by those skilled in the art that modes and details can be modified in various ways without departing from the spirit and scope of the present invention. Therefore, the present invention should not be construed as being limited to the description in the following embodiments.

Note that the position, size, range, and the like of each component illustrated in drawings and the like are not accurately represented in some cases for easy understanding. Therefore, one embodiment of the present invention is not necessarily limited to the position, size, range, and the like disclosed in the drawings and the like.

In this specification and the like, ordinal numbers such as first, second, and third are used in order to avoid confusion among components, and the terms do not limit the number of components.

(Embodiment 1)

In this embodiment, a structure and a manufacturing method of a semiconductor device according to one embodiment of the present invention will be described with reference to FIGS. 1A and 1B, FIGS. 2A to 2D, FIGS. 3A to 3D, FIGS. 4A to 4D, FIGS. 5A and 5B, FIGS. 6A and 6B, and FIGS. 7A-1, 7A-2, and 7B.

<Cross-Sectional Structure and Plan View of Semiconductor Device>

Figure 1B:
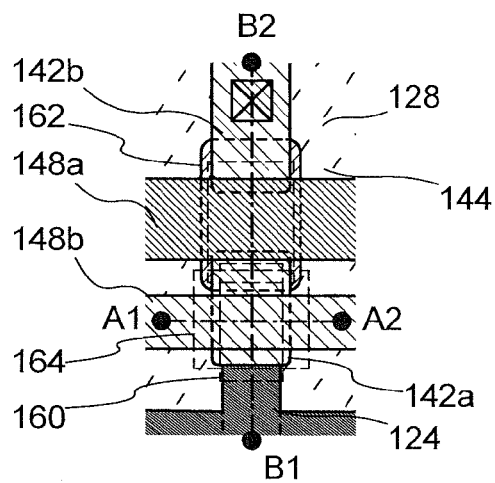

FIGS. 1A and 1B illustrate an example of a structure of a semiconductor device. FIG. 1A is a cross-sectional view of the semiconductor device. FIG. 1B is a plan view of the semiconductor device. In FIG. 1A, the cross section A1-A2 is perpendicular to the channel length direction of a transistor, and the cross section B1-B2 is parallel to the channel length direction of the transistor. The semiconductor device illustrated in FIGS. 1A and 1B includes a transistor 160 including a first semiconductor material in a lower portion, and a transistor 162 including a second semiconductor material in an upper portion. FIGS. 1A and 1B show that the semiconductor device including one transistor 160, one transistor 162, and one capacitor 164; alternatively, the semiconductor device may include a plurality of transistors 160, transistors 162, and capacitors 164.

Here, the first semiconductor material is preferably different from the second semiconductor material. For example, the first semiconductor material can be a semiconductor material other than an oxide semiconductor, and the second semiconductor material can be an oxide semiconductor. The semiconductor material other than an oxide semiconductor can be, for example, silicon, germanium, silicon germanium, silicon carbide, or gallium arsenide and is preferably single crystalline. Alternatively, an organic semiconductor material or the like may be used. A transistor including such a semiconductor material is easy to operate at high speed. On the other hand, a transistor including an oxide semiconductor can hold charge for a long time owing to its characteristics.

The transistor 160 and the transistor 162 can be either an n-channel transistor or a p-channel transistor. Here, the case where the transistors 160 and 162 are n-channel transistors will be described. The technical feature of one embodiment of the present invention lies in that a semiconductor material with which off-state current can be sufficiently reduced, such as an oxide semiconductor, is used in the transistor 162 in order to hold data. Therefore, it is not necessary to limit specific conditions such as a material or a structure of the semiconductor device, to those given here.

The transistor 160 includes a channel formation region 116 provided in a substrate 100 containing a semiconductor material (e.g., silicon), impurity regions 120 (also referred to as a source region and a drain region) provided so that the channel formation region 116 is placed therebetween, metal compound regions 124 in contact with the impurity regions 120, a gate insulating layer 108 provided over the channel formation region 116, and a gate electrode 110 provided over the gate insulating layer 108. Note that FIGS. 1A and 1B illustrate an element in which distinct source and drain electrodes are not provided; the element in such a state is sometimes referred to as a transistor for the sake of convenience. In such a case, in order to describe connection of a transistor, a source region and a source electrode are collectively referred to as a "source electrode" and a drain region and a drain electrode are collectively referred to as a "drain electrode" in some cases. That is, in this specification, the term "source electrode" may include a source region.

An electrode 126 is connected to part of the metal compound region 124 of the transistor 160. The electrode 126 functions as a source electrode or a drain electrode of the transistor 160. Further, an element isolation insulating layer 106 is formed on the substrate 100 so as to surround the transistor 160, and an insulating layer 128 is provided over the transistor 160. Note that in order to obtain higher integration, the transistor 160 preferably does not include a sidewall insulating layer as illustrated in FIGS. 1A and 1B. On the other hand, in the case where characteristics of the transistor 160 are emphasized, a sidewall insulating layer may be provided on a side surface of the gate electrode 110 and the impurity regions 120 may include an impurity region having a different impurity concentration in a region overlapping with the sidewall insulating layer.

The transistor 162 includes an oxide semiconductor layer 144 provided over the insulating layer 128 and the like, a source/drain electrode 142a and a source/drain electrode 142b electrically connected to the oxide semiconductor layer 144, a gate insulating layer 146 covering the oxide semiconductor layer 144 and the source/drain electrodes 142a and 142b, and a gate electrode 148a provided over the gate insulating layer 146 so as to overlap with the oxide semiconductor layer 144.

Here, the oxide semiconductor layer 144 used in the transistor 162 is preferably highly purified by sufficient removal of impurities such as hydrogen. For example, the concentration of hydrogen in the oxide semiconductor layer 144 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the hydrogen concentration of the oxide semiconductor layer 144 is measured by secondary ion mass spectrometry (SIMS). Oxygen vacancies in the oxide semiconductor layer 144 are preferably reduced by sufficient supply of oxygen. The carrier concentration of the oxide semiconductor layer 144, which is highly purified by a sufficient reduction in hydrogen concentration and is reduced in defect levels in the energy gap due to oxygen vacancies by sufficient supply of oxygen, is lower than $1\times10^{12}/\text{cm}^3$, preferably lower than $1\times10^{11}/\text{cm}^3$, further preferably lower than $1.45\times10^{10}/\text{cm}^3$. For example, the off-state current (here, per unit channel width (1 μm)) at room temperature (25° C.) is lower than or equal to 100 zA (1 zA (zeptoampere) is $1\times10^{-21}$ A), preferably lower than or equal to 10 zA. By using the purified oxide semiconductor layer 144 which becomes intrinsic (i-type) or substantially intrinsic, the transistor 162 with excellent off-current characteristics can be obtained.

The oxide semiconductor layer which is processed to have an island shape is used in order to suppress leakage current generated between elements due to miniaturization in the transistor 162; alternatively, an oxide semiconductor layer that is not processed into an island shape may be employed. In the case where the oxide semiconductor layer is not processed into an island shape, contamination of the oxide semiconductor layer due to etching in processing can be prevented.

The capacitor 164 includes the source/drain electrode 142a, the gate insulating layer 146, and a conductive layer 148b. That is, the source/drain electrode 142a functions as one electrode of the capacitor 164, and the conductive layer 148b functions as the other electrode of the capacitor 164. With such a structure, sufficient capacitance can be secured. In the case where the oxide semiconductor layer 144 and the gate insulating layer 146 are stacked, insulating properties between the source/drain electrode 142a and the conductive layer 148b can be adequately secured. Alternatively, the capacitor 164 may be omitted if a capacitance is not needed.

Note that in the transistor 162 and the capacitor 164, end portions of the source/drain electrode 142a and the source/drain electrode 142b are preferably tapered. The tapered end portions of the source/drain electrodes 142a and 142b can improve coverage thereof with the gate insulating layer 146 and prevent disconnection. Here, the taper angle is 30° to 60°, for example. Note that the taper angle refers to an inclination angle formed by a side surface and a bottom surface of a layer having a tapered shape (e.g., the source/drain electrode 142a) when the layer is observed from the direction perpendicular to the cross section of the layer (i.e., the plane perpendicular to the surface of the substrate).

An insulating layer 150 and an insulating layer 152 are provided over the transistor 162 and the capacitor 164. An electrode 154 is provided in an opening formed in the gate insulating layer 146, the insulating layer 150, the insulating layer 152, and the like. A wiring 156 connected to the electrode 154 is formed over the insulating layer 152. The wiring 156 connects one memory cell to another memory cell. Note that although the metal compound region 124, the source/drain electrode 142b, and the wiring 156 are connected to each other through the electrode 126 and the electrode 154 in FIGS. 1A and 1B, one embodiment of the present invention is not limited to having this structure. For example, the source/drain electrode 142b may be directly in contact with the metal compound region 124. Alternatively, the wiring 156 may be directly in contact with the source/drain electrode 142b.

In FIGS. 1A and 1B, the electrode 126 for connecting the metal compound region 124 to the source/drain electrode 142b and the electrode 154 for connecting the source/drain electrode 142b to the wiring 156 overlap with each other. In other words, a region where the electrode 126 functioning as a source electrode or a drain electrode of the transistor 160 is in contact with the source/drain electrode 142b of the transistor 162 overlaps with a region where the source/drain electrode 142b of the transistor 162 is in contact with the electrode 154. With such a planar layout, the increase in the element area due to the contact regions can be suppressed. In other words, the degree of integration of the semiconductor device can be increased.

In FIGS. 1A and 1B, the transistor 160 and the transistor 162 are provided to at least partly overlap with each other. Moreover, the transistor 162 and the capacitor 164 are provided to overlap with the transistor 160. For example, the conductive layer 148b of the capacitor 164 is provided to at least partly overlap with the gate electrode 110 of the transistor 160. By employing such a planar layout, high integration can be realized. For example, given that the minimum feature size is F, the area of a memory cell can be 15 $F^2$ to 25 $F^2$.

Note that in the case where the transistor 160 and the transistor 162 are provided to at least partly overlap with each other, the source region or the drain region of the transistor 160 might function as a backgate electrode of the transistor 162. The backgate electrode here refers to a pseudo backgate electrode provided opposite to the gate electrode 148a with a channel formation region in the oxide semiconductor layer 144 interposed therebetween. In other words, when the source region or the drain region of the transistor 160 is supplied with a positive potential and the positive potential exceeds the threshold voltage Vth(back) that is set by the backgate electrode, the transistor 162 is turned on. Even when a positive potential applied to the source region or the drain region of the transistor 160 is at a level at which the transistor 162 is not turned on, the threshold voltage $V_{th}$ of the transistor 162 is shifted negatively (shifted to normally-on side). For example, when a positive potential is applied to the source region or the drain region of the transistor 160 in a read operation of the semiconductor device, the threshold voltage $V_{th}$ of the transistor 162 is shifted negatively (shifted to the normally-on side) and the leakage current of the transistor 162 is increased, which might result in deterioration of charge retention characteristics. Consequently, memory retention might deteriorate. Note that memory retention refers to data retention characteristics of a memory.

The reasons that the source region or the drain region of the transistor 160 functions as a backgate electrode of the transistor 162 are the thickness and dielectric constant of the insulating layer 128 provided between the source region or the drain region of the transistor 160 and the channel formation region in the oxide semiconductor layer 144, for example. When the insulating layer 128 is too thin, the potential of the source region or the drain region of the transistor 160 has a large influence on the oxide semiconductor layer 144. When the dielectric constant of the insulating layer 128 is too high, the potential of the source region or the drain region of the transistor 160 also has a large influence on the oxide semiconductor layer 144.

Therefore, in order to reduce the influence of the source region or the drain region of the transistor 160 as the backgate electrode of the transistor 162, the insulating layer 128 and the gate insulating layer 146 in the transistor 162 preferably satisfy Formula 1, in which the insulating layer 128 is estimated in terms of a thickness of the gate insulating layer 146.

$$\frac{t_a}{t_b} \cdot \frac{\varepsilon_{rb}}{\varepsilon_{ra}} < 0.1 \qquad \text{[Formula 1]}$$

(Note that in Formula 1, $t_a$ represents the thickness of the gate insulating layer 146; $t_b$ represents the thickness of the insulating layer 128; $\varepsilon_{ra}$ represents the dielectric constant of the gate insulating layer 146; and $\varepsilon_{rb}$ represents the dielectric constant of the insulating layer 128.)

When Formula 1 is satisfied, the influence of the potential of the source region or the drain region of the transistor 160 on the oxide semiconductor layer 144 is less than one-tenth of the influence of the gate electrode of the transistor 162 on the oxide semiconductor layer 144. That is, it is possible to extremely reduce the influence of the potential of the source region or the drain region of the transistor 160 on the oxide semiconductor layer 144, so that the source region or the drain region of the transistor 160 does not substantially function as a backgate electrode.

Another preferable condition for reducing the influence of the source region or the drain region of the transistor 160 as the backgate electrode of the transistor 162 will be described. It is assumed that the source region or the drain region of the transistor 160 is supplied with Vmax at the maximum when a memory cell including the transistor 162 retains data (e.g., in the case where the memory cell is not selected in a write operation of the semiconductor device) or reads data. In that case, the threshold voltage $V_{th}$ of the transistor 162 is shifted negatively (shifted to normally-on side); when the threshold voltage $V_{th}$ of the transistor 162 becomes negative, charge retention of the memory cell is significantly lowered. That is, the preferable condition is that the threshold voltage $V_{th}$ of the transistor 162 is positive.

The shift range of the threshold voltage of the transistor 162 at the time when the potential of the source region or the drain region of the transistor 160 is changed from 0 V to Vmax is presented by Formula 2 in most cases.

$$-V_{max} \cdot \frac{t_a}{t_b} \cdot \frac{\varepsilon_{rb}}{\varepsilon_{ra}} \qquad \text{[Formula 2]}$$

Accordingly, Formula 3 is satisfied in order that the threshold voltage $V_{th}$ of the transistor 162 is kept positive even when the potential of the source region or the drain region of the transistor 160 is changed from 0 V to Vmax.

$$V_{th} - V_{max} \cdot \frac{t_a}{t_b} \cdot \frac{\varepsilon_{rb}}{\varepsilon_{ra}} > 0 \qquad \text{[Formula 3]}$$

Needless to say, the potential Vmax depends on the circuit configuration and the driving method; the potential Vmax is typically a power supply potential used in a read operation. Alternatively, a potential supplied to a floating gate portion FG is sometimes supplied to the source region or the drain region of the transistor 160, in which case the maximum potential supplied to the floating gate portion FG is sometimes the potential Vmax.

When Formula 1 or Formula 3 is satisfied, the source region or the drain region of the transistor 160 does not substantially function as a backgate electrode of the transistor 162. In other words, shift of the threshold voltage of the transistor 162 can be sufficiently suppressed. Thus, memory retention of the semiconductor device can be improved.

<Method for Manufacturing Semiconductor Device>

Next, an example of a method for manufacturing the semiconductor device will be described. First, a method for manufacturing the transistor 160 in the lower portion will be described below with reference to FIGS. 2A to 2D and FIGS. 3A to 3D. Then, a method for manufacturing the transistor 162 in the upper portion and the capacitor 164 will be described with reference to FIGS. 4A to 4D and FIGS. 5A and 5B.

<Method for Manufacturing Transistor in Lower Portion>

A method for manufacturing the transistor 160 in the lower portion will be described with reference to FIGS. 2A to 2D and FIGS. 3A to 3D.

First, a substrate 100 containing a semiconductor material is prepared. As the substrate containing a semiconductor material, a single crystal semiconductor substrate or a polycrystalline semiconductor substrate of silicon, silicon carbide, or the like; a compound semiconductor substrate of silicon germanium or the like; an SOI substrate, or the like can be used. Here, an example where a single crystal silicon substrate is used as the substrate 100 containing a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided on an insulating surface in its category. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer placed therebetween.

As the substrate 100 containing a semiconductor material, a single crystal semiconductor substrate of silicon or the like is preferable because the speed of the read operation of the semiconductor device can be increased.

Figure 2A:
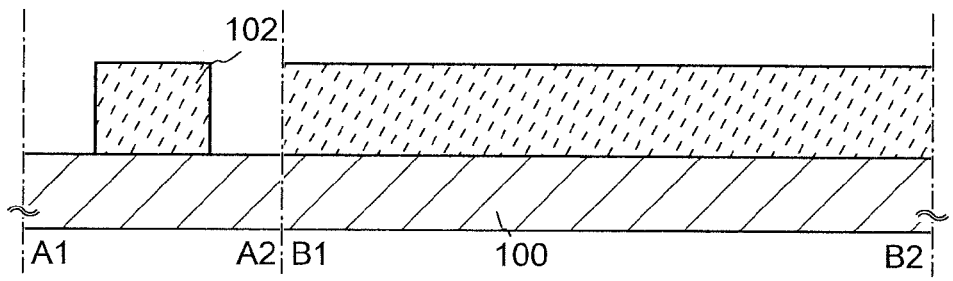
FIGS. 2A to 2D are cross-sectional views illustrating a process of manufacturing a semiconductor device.
Figure 2B:
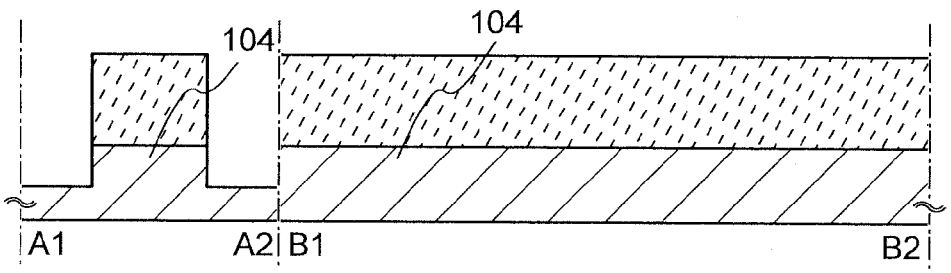

A protective layer 102 serving as a mask for forming an element isolation insulating layer is formed over the substrate 100 (see FIG. 2A). As the protective layer 102, an insulating layer formed using silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Next, part of the substrate 100 which is not covered with the protective layer 102 (i.e., the substrate 100 in an exposed region) is removed by etching with the use of the protective layer 102 as a mask. Thus, a semiconductor region 104 that is isolated from another semiconductor region is formed (see FIG. 2B). As the etching, dry etching is preferably performed, but wet etching can be performed. An etching gas or an etchant can be selected as appropriate depending on materials of layers to be etched.

Figure 2C:
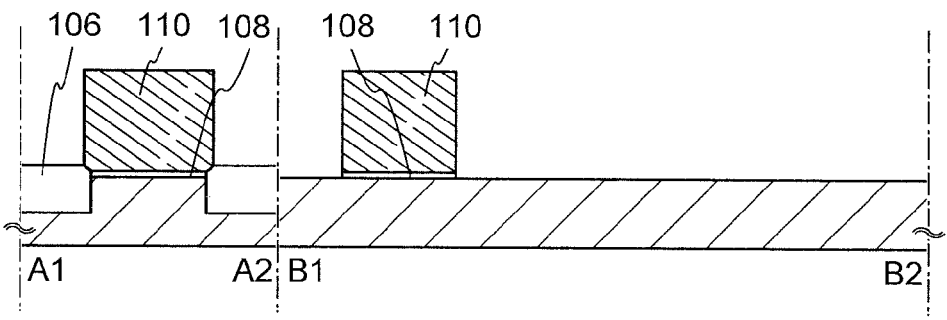

Then, an insulating layer is formed so as to cover the semiconductor region 104 and the insulating layer in a region overlapping with the semiconductor region 104 is selectively removed, so that an element isolation insulating layer 106 is formed (see FIG. 2C). The insulating layer is formed using silicon oxide, silicon nitride, silicon oxynitride, or the like. As a method for removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layer 106.

Here, CMP treatment is a method of planarizing a surface of an object to be processed with a combination of chemical and mechanical actions, using the surface as a reference. Specifically, CMP treatment is a method in which a polishing cloth is attached to a polishing stage, the polishing stage and an object to be processed are rotated or swung while a slurry (an abrasive) is supplied between the object and the polishing cloth, and the surface of the object is polished by chemical reaction between the slurry and the surface of the object and by action of mechanical polishing of the object with the polishing cloth.

Note that the element isolation insulating layer 106 may be formed by forming an insulating region by introduction of oxygen, for example, as well as by performing selective etching of the insulating layer.

Next, an insulating layer is formed on a surface of the semiconductor region 104, and a layer containing a conductive material is formed over the insulating layer.

The insulating layer is to be a gate insulating layer later and can be formed by performing heat treatment (e.g., thermal oxidation treatment or thermal nitridation treatment) on the surface of the semiconductor region 104, for example. Instead of heat treatment, high-density plasma treatment may be employed. High-density plasma treatment can be performed using, for example, a mixed gas of any of a rare gas such as He, Ar, Kr, or Xe, oxygen, nitrogen oxide, ammonia, nitrogen, and hydrogen. Needless to say, the insulating layer may be formed by CVD, sputtering, or the like. The insulating layer preferably has a single-layer structure or a stacked structure of a film containing silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like. The thickness of the insulating layer can be, for example, 1 nm to 100 nm, preferably 10 nm to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and any of a variety of film formation methods such as evaporation, CVD, sputtering, and spin coating can be employed. Note that this embodiment shows an example of the case where the layer containing a conductive material is formed using a metal material.

After that, the insulating layer and the layer containing a conductive material are selectively etched, so that a gate insulating layer 108 and a gate electrode 110 are formed (see FIG. 2C).

Figure 2D:
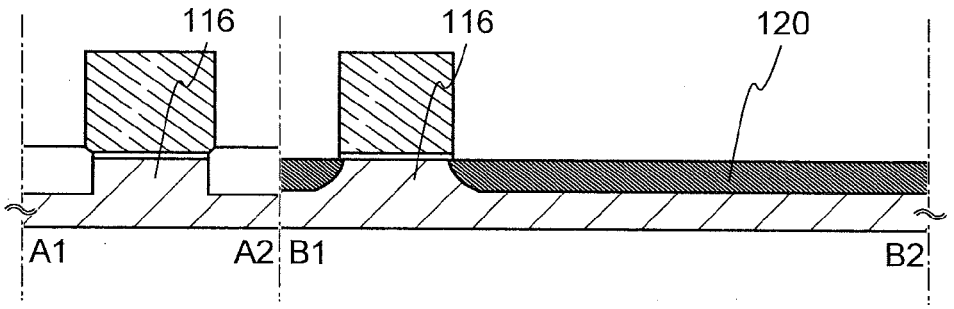

Next, phosphorus (P), arsenic (As), or the like is added to the semiconductor region 104, so that a channel formation region 116 and impurity regions 120 are formed (see FIG. 2D). Note that phosphorus or arsenic is added here in order to form an n-channel transistor; an impurity element such as boron (B) or aluminum (Al) is added in the case of forming a p-channel transistor. Here, the concentration of the impurity added can be set as appropriate; the concentration is preferably increased when the size of a semiconductor element is extremely decreased.

Note that a sidewall insulating layer may be formed around the gate electrode 110 so that an impurity region to which an impurity element is added at a different concentration may be formed.

Figure 3A:
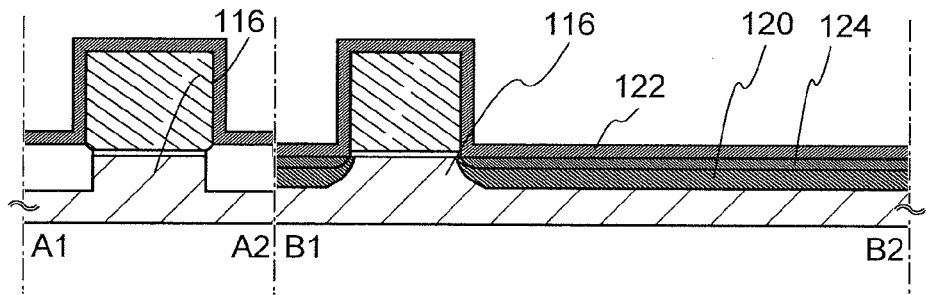
FIGS. 3A to 3D are cross-sectional views illustrating a process of manufacturing a semiconductor device.

Next, a metal layer 122 is formed so as to cover the gate electrode 110, the impurity regions 120, and the like (see FIG. 3A). The metal layer 122 can be formed by any of a variety of film formation methods such as vacuum evaporation, sputtering, and spin coating. The metal layer 122 is preferably formed using a metal material that reacts with a semiconductor material included in the semiconductor region 104 to be a low-resistance metal compound. Examples of such metal materials are titanium, tantalum, tungsten, nickel, cobalt, and platinum.

Then, heat treatment is performed so that the metal layer 122 reacts with the semiconductor material. Thus, metal compound regions 124 that are in contact with the impurity regions 120 are formed (see FIG. 3A). Note that in the case where the gate electrode 110 is formed using polycrystalline silicon or the like, a metal compound region is also formed in a region of the gate electrode 110 in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction for formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Figure 3B:
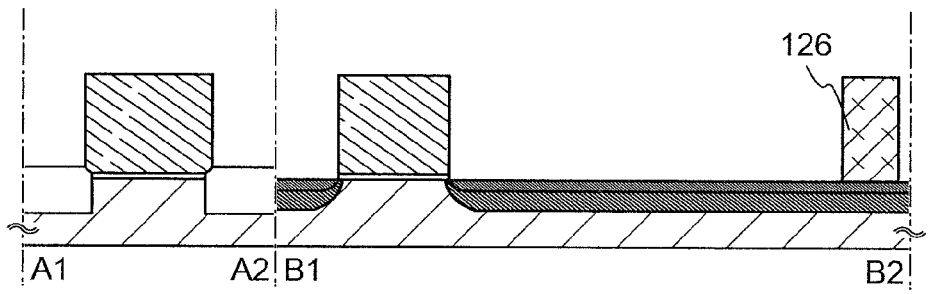

Next, an electrode 126 is formed in a region in contact with part of the metal compound region 124 (see FIG. 3B). The electrode 126 is formed by, for example, forming a layer containing a conductive material and then selectively etching the layer. The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and any of a variety of film formation methods such as evaporation, CVD, sputtering, and spin coating can be employed.

Figure 3C:
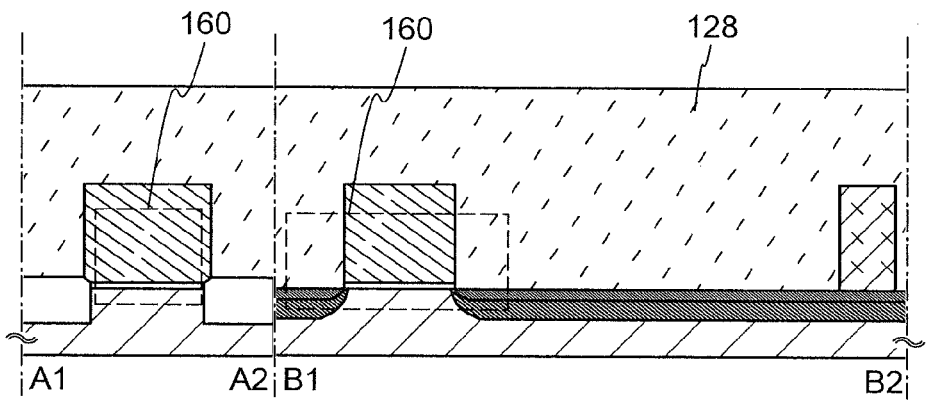

Then, an insulating layer 128 is formed to cover the components formed in the above steps (see FIG. 3C). The insulating layer 128 can be formed using a material including an inorganic insulating material such as silicon oxide, silicon oxynitride, silicon nitride, or aluminum oxide. In particular, a material with a low dielectric constant (a low-k material) is preferably used for the insulating layer 128, because capacitance due to overlap of electrodes or wirings can be sufficiently reduced. Note that the insulating layer 128 may be a porous insulating layer formed using any of these materials. Since the porous insulating layer has a lower dielectric constant than a dense insulating layer, capacitance due to electrodes or wirings can be further reduced. Alternatively, the insulating layer 128 can be formed using an organic insulating material such as polyimide or acrylic. Note that although the insulating layer 128 has a single-layer structure here, one embodiment of the present invention is not limited to this example. The conductive layer 128 may have a stacked structure including two or more layers. In the case of employing a three-layer structure, the insulating layer 128 can have a stacked structure of a silicon oxynitride layer, a silicon nitride oxide layer, and a silicon oxide layer, for example.

Alternatively, the electrode 126 can be formed after the formation of the insulating layer 128 so as to fill an opening that is formed in the insulating layer 128 to reach the metal compound region 124.

In that case, it is possible to use a method, for example, in which a thin titanium film is formed in a region including the opening by PVD and a thin titanium nitride film is formed by CVD, and then a tungsten film is formed so as to fill the opening. Here, the titanium film formed by PVD has a function of reducing an oxide film (e.g., a natural oxide film) formed on a surface where the titanium film is formed, thereby lowering the contact resistance with the lower electrode or the like (the metal compound region 124, here). The titanium nitride film formed after the formation of the titanium film has a barrier function of preventing diffusion of the conductive material. A copper film may be formed by plating after the formation of the barrier film of titanium, titanium nitride, or the like.

Through the above steps, the transistor 160 is formed with the use of the substrate 100 containing a semiconductor material (see FIG. 3C). Such a transistor 160 is capable of high-speed operation. Thus, when the transistor is used as a reading transistor, data can be read at high speed.

Figure 3D:
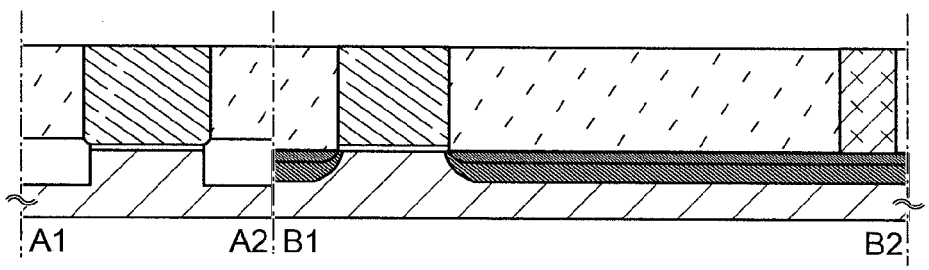

After that, as treatment before the formation of the transistor 162 and the capacitor 164, CMP treatment is performed on the insulating layer 128 to expose upper surfaces of the gate electrode 110 and the electrode 126 (see FIG. 3D). As treatment for exposing the upper surfaces of the gate electrode 110 and the electrode 126, etching treatment or the like can be employed as well as CMP treatment; the surface of the insulating layer 128 is preferably made as flat as possible in order to improve characteristics of the transistor 162.

Note that before or after the above steps, a step for forming an additional electrode, wiring, semiconductor layer, or insulating layer may be performed. For example, when a multilayer wiring structure in which an insulating layer and a conductive layer are stacked is employed as a wiring structure, a highly integrated semiconductor device can be provided.

<Method for Manufacturing Transistor in Upper Portion>

Next, a method for manufacturing the transistor 162 in the upper portion and the capacitor 164 will be described with reference to FIGS. 4A to 4D and FIGS. 5A and 5B.

Figure 4A:
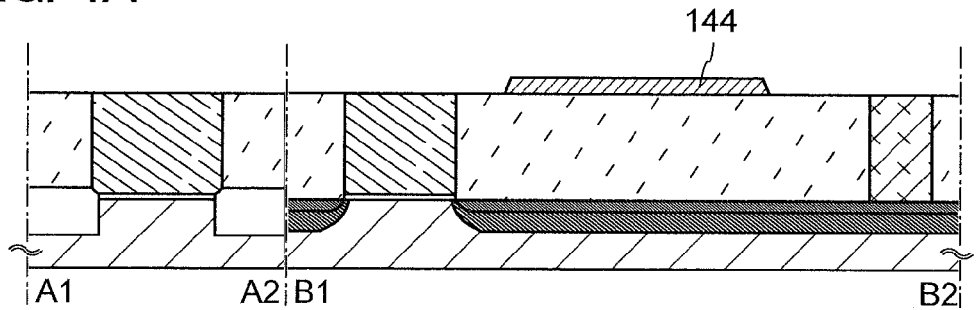
FIGS. 4A to 4D are cross-sectional views illustrating a process of manufacturing a semiconductor device.

First, an oxide semiconductor layer is formed over the gate electrode 110, the electrode 126, the insulating layer 128, and the like and is processed, so that an oxide semiconductor layer 144 is formed (see FIG. 4A). Note that an insulating layer functioning as a base may be formed over the gate electrode 110, the electrode 126, and the insulating layer 128 before the oxide semiconductor layer is formed. The insulating layer can be formed by PVD such as sputtering, or CVD such as plasma CVD.

As an oxide semiconductor used for the oxide semiconductor layer, any of the following oxide semiconductors can be used, for example: an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; an oxide of one metal element, such as an In—O-based oxide semiconductor; a Sn—O-based oxide semiconductor; and a Zn—O-based oxide semiconductor. In addition, the above materials may contain $SiO_2$. Here, for example, an In—Ga—Zn—O-based material means an oxide containing indium (In), gallium (Ga), and zinc (Zn), and there is no particular limitation on the composition ratio. Further, the In—Ga—Zn—O-based oxide semiconductor may contain an element other than In, Ga, and Zn.

As the oxide semiconductor layer, a thin film using a material represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, or Ga and Co.

In the case where an In—Ga—Zn—O-based material is used as the oxide semiconductor, an oxide target having a composition ratio of $In_2O_3:Ga_2O_3:ZnO=1:1:1$ [molar ratio] can be used as a target, for example. Note that it is not necessary to limit the material and the composition ratio of the target to the above. For example, a target having a composition ratio of $In_2O_3:Ga_2O_3:ZnO=1:1:2$ [molar ratio] can be used.

In the case where an In—Zn—O-based material is used as the oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, when a target used for forming an In—Zn—O-based oxide semiconductor has an atomic ratio of In:Zn:O=X:Y:Z, the relation of Z>1.5X+Y is satisfied.

The filling rate of the target is 90% to 100%, preferably 95% to 99.9%. With the use of a target with a high filling rate, a dense oxide semiconductor layer can be deposited.

The thickness of the oxide semiconductor layer is preferably greater than or equal to 3 nm and less than or equal to 30 nm. This is because the transistor might be normally on when the oxide semiconductor layer is too thick (e.g., the thickness is 50 nm or more).

The oxide semiconductor layer is preferably formed by a method with which impurities such as hydrogen, water, a hydroxyl group, or a hydride are not likely to enter the oxide semiconductor layer. For example, the oxide semiconductor layer can be formed by sputtering.

In this embodiment, the oxide semiconductor layer is formed by sputtering using an In—Ga—Zn—O-based oxide target.

The deposition atmosphere may be a rare gas (typically argon) atmosphere, an oxygen atmosphere, or a mixed atmosphere containing a rare gas and oxygen. Moreover, it is preferable to employ an atmosphere using a high-purity gas from which impurities such as hydrogen, water, a hydroxyl group, or a hydride are removed, in order to prevent hydrogen, water, a hydroxyl group, a hydride, or the like from entering the oxide semiconductor layer.

For example, the oxide semiconductor layer can be formed as follows.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen, water, a hydroxyl group, or a hydride are sufficiently removed is introduced into the deposition chamber from which remaining moisture is being removed, and the oxide semiconductor layer is formed over the substrate with the use of the target. In order to remove moisture remaining in the deposition chamber, an entrapment vacuum pump such as a cryopump, an ion pump, or a titanium sublimation pump is preferably used. Further, an evacuation unit may be a turbo pump provided with a cold trap. In the deposition chamber which is evacuated with the cryopump, for example, impurities such as hydrogen, water, a hydroxyl group, or a hydride (preferably, also a compound containing a carbon atom) and the like are removed, whereby the concentration of impurities such as hydrogen, water, a hydroxyl group, or a hydride in the oxide semiconductor layer formed in the deposition chamber can be reduced.

In the case where the substrate temperature is low (e.g., 100° C. or lower) during deposition, a substance including a hydrogen atom may enter the oxide semiconductor; thus, it is preferable that the substrate be heated at a temperature in the above range. When the oxide semiconductor layer is formed with the substrate heated at the above-described temperature, the substrate temperature is high, so that hydrogen bonds are cut by heat and the substance including a hydrogen atom is less likely to be taken into the oxide semiconductor layer. Therefore, by forming the oxide semiconductor layer with the substrate heated at the above temperature, the concentration of impurities such as hydrogen, water, a hydroxyl group, or a hydride in the oxide semiconductor layer can be sufficiently reduced. Moreover, damage due to sputtering can be reduced.

An example of the deposition conditions is as follows: the distance between the substrate and the target is 60 mm, the pressure is 0.4 Pa, the direct-current (DC) power is 0.5 kW, the substrate temperature is 400° C., and the deposition atmosphere is an oxygen atmosphere (the flow rate of the oxygen is 100%). Note that it is preferable to use a pulsed direct-current power source because powder substances (also referred to as particles or dust) generated during deposition can be reduced and the film thickness can be uniform.

Note that before the oxide semiconductor layer is formed by sputtering, powdery substances (also referred to as particles or dust) attached on a surface where the oxide semiconductor layer is to be formed are preferably removed by reverse sputtering in which an argon gas is introduced and plasma is generated. The reverse sputtering refers to a method in which voltage is applied to a substrate side to generate plasma in the vicinity of the substrate to modify a surface of the substrate. Note that a gas of nitrogen, helium, oxygen, or the like may be used instead of argon.

The oxide semiconductor layer can be processed by being etched after a mask having a desired shape is formed over the oxide semiconductor layer. The mask may be formed by photolithography, ink-jet, or the like. For the etching of the oxide semiconductor layer, either wet etching or dry etching may be employed. Needless to say, both of them may be employed in combination.

After that, heat treatment (first heat treatment) may be performed on the oxide semiconductor layer 144. The heat treatment can further eliminate substances including hydrogen atoms in the oxide semiconductor layer 144; thus, the structure of the oxide semiconductor layer 144 can be improved and defect levels in energy gap can be reduced. The heat treatment is performed under an inert gas atmosphere at greater than or equal to 250° C. and less than or equal to 700° C., preferably greater than or equal to 450° C. and less than or equal to 600° C. or less than a strain point of the substrate. The inert gas atmosphere is preferably an atmosphere that contains nitrogen or a rare gas (e.g., helium, neon, or argon) as its main component and does not contain water, hydrogen, or the like. For example, the purity of nitrogen or a rare gas such as helium, neon, or argon which is introduced into a heat treatment apparatus is 6N (99.9999%) or higher, preferably 7N (99.99999%) or higher (i.e., the impurity concentration is 1 ppm or lower, preferably 0.1 ppm or lower).

The heat treatment can be performed in the following manner, for example: an object to be heated is introduced into an electric furnace including a resistance heating element or the like, and heated at 450° C. for 1 hour in a nitrogen atmosphere. The oxide semiconductor layer 144 is not exposed to the air during the heat treatment in order to prevent entry of water and hydrogen.

The above heat treatment can be referred to as dehydration treatment, dehydrogenation treatment, or the like because of its advantageous effect of removing hydrogen, water, and the like. The heat treatment can be performed, for example, before the oxide semiconductor layer is processed into an island shape or after the gate insulating layer is formed. Such dehydration treatment or dehydrogenation treatment may be conducted once or plural times.

Figure 4B:
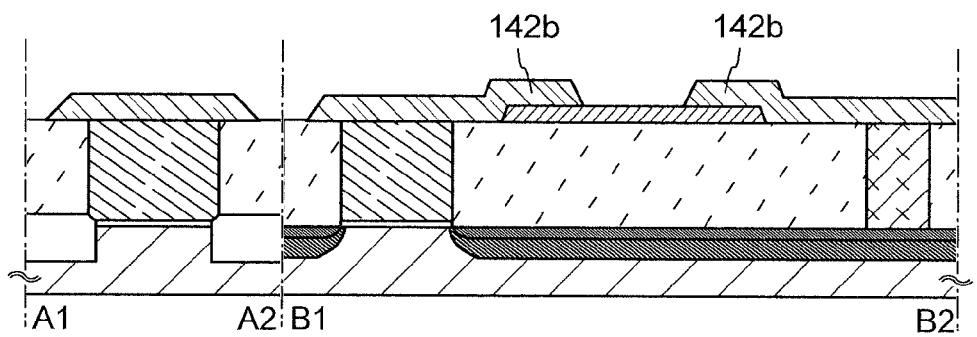

Next, a conductive layer for forming a source electrode and a drain electrode (as well as a wiring) is formed over the oxide semiconductor layer 144 and the like and is processed, so that a source/drain electrode 142a and a source/drain electrode 142b are formed (see FIG. 4B).

The conductive layer can be formed by PVD or CVD. As a material for the conductive layer, an element selected from aluminum, chromium, copper, tantalum, titanium, molybdenum, and tungsten; an alloy containing any of these elements as a component; or the like can be used. Further, one material selected from manganese, magnesium, zirconium, beryllium, neodymium, and scandium or a combined material of any of these materials may be used.

The conductive layer can have a single-layer structure or a stacked structure including two or more layers. For example, the conductive layer can have a single-layer structure of a titanium film or a titanium nitride film; a single-layer structure of an aluminum film containing silicon; a two-layer structure in which a titanium film is stacked over an aluminum film; a two-layer structure in which a titanium film is stacked over a titanium nitride film; or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source/drain electrodes 142a and 142b having tapered shapes.

Alternatively, the conductive layer may be formed using conductive metal oxide. The conductive metal oxide can be indium oxide ($In_2O_3$), tin oxide ($SnO_2$), zinc oxide (ZnO), an alloy of indium oxide and tin oxide ($In_2O_3$—$SnO_2$, sometimes referred to as ITO), an alloy of indium oxide and zinc oxide ($In_2O_3$—ZnO), or any of these metal oxide materials containing silicon or silicon oxide.

The conductive layer is preferably etched so that edge portions of the source/drain electrodes 142a and 142b are tapered. Here, the taper angle is preferably greater than or equal to 30° and less than or equal to 60°, for example. When the source/drain electrodes 142a and 142b are etched so that the end portions are tapered, coverage thereof with a gate insulating layer 146 formed later can be improved and disconnection can be prevented.

The channel length (L) of the transistor in the upper portion is decided by a distance between a lower edge portion of the source/drain electrode 142a and a lower edge portion of the source/drain electrode 142b. Note that for light exposure for forming a mask used when a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For those reasons, the channel length (L) of the transistor to be formed later can be in the range of 10 nm to 1000 nm (1 μm) inclusive, and the circuit can operate at higher speed. Moreover, miniaturization can lead to lower power consumption of the semiconductor device.

Figure 4C:
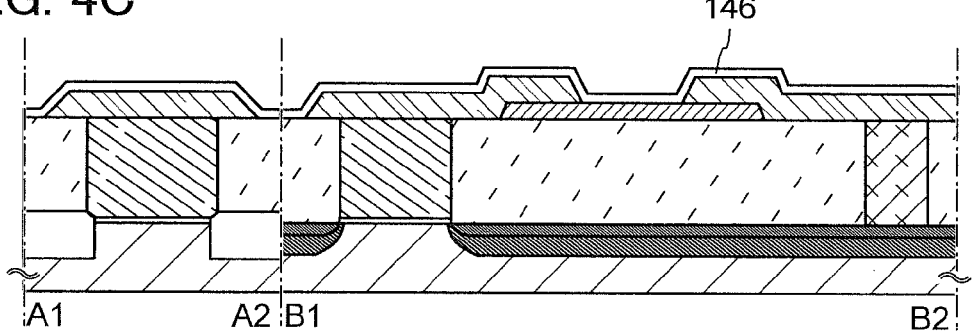

Next, the gate insulating layer 146 is formed so as to cover the source/drain electrodes 142a and 142b and to be in contact with part of the oxide semiconductor layer 144 (see FIG. 4C).

The gate insulating layer 146 can be formed by CVD, sputtering, or the like. The gate insulating layer 146 is formed using silicon oxide, silicon nitride, silicon oxynitride, or the like. Alternatively, the gate insulating layer 146 can be formed using a material including an element of Group 13 and oxygen. As the material including an element of Group 13 and oxygen, gallium oxide, aluminum oxide, or aluminum gallium oxide can be used, for example. Further, the gate insulating layer 146 may be formed using a material including tantalum oxide, hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), or the like. The gate insulating layer 146 may have a single-layer structure or a stacked structure including a combination of the above materials. There is no particular limitation on the thickness of the gate insulating layer 146; when the semiconductor device is miniaturized, the thickness is preferably small for ensuring operation of the transistor. For example, in the case of using silicon oxide, the thickness can be set to greater than or equal to 1 nm and less than or equal to 100 nm, preferably greater than or equal to 10 nm and less than or equal to 50 nm.

The gate insulating layer 146 is preferably formed by a method with which impurities such as hydrogen and water do not enter the gate insulating layer 146. This is because, if impurities such as hydrogen or water are included in the gate insulating layer 146, the impurities such as hydrogen or water may enter an oxide semiconductor film formed later or oxygen in the oxide semiconductor film may be extracted by the impurities such as hydrogen or water, so that a back channel of the oxide semiconductor film might have lower resistance (have n-type conductivity) and a parasitic channel might be formed. Therefore, the gate insulating layer 146 is preferably formed so as to include impurities such as hydrogen or water as few as possible. For example, the gate insulating layer 146 is preferably formed by sputtering. A high-purity gas from which impurities such as hydrogen or water are removed is preferably used as a sputtering gas used for film formation.

A lot of oxide semiconductor materials that can be used for the oxide semiconductor layer 144 contain an element of Group 13. Therefore, in the case where the gate insulating layer 146 in contact with the oxide semiconductor layer 144 is formed using a material including an element of Group 13 and oxygen, the state of the interface between the gate insulating layer 146 and the oxide semiconductor layer 144 can be kept favorable. This is because the material including an element of Group 13 and oxygen is well matched with an oxide semiconductor material. For example, when the oxide semiconductor layer 144 and the gate insulating layer 146 containing gallium oxide are provided in contact with each other, hydrogen pile-up at the interface between the oxide semiconductor layer 144 and the gate insulating layer 146 can be reduced. The gate insulating layer 146 is preferably formed using aluminum oxide through which water is not easily transmitted, in terms of preventing entry of water to the oxide semiconductor layer 144.

When the gate insulating layer is thin as in the above description, a problem of gate leakage due to the tunnel effect or the like can be caused. In order to solve the problem of gate leakage, the gate insulating layer 146 is preferably formed using a high dielectric constant (high-k) material such as hafnium oxide, tantalum oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), or hafnium aluminate to which nitrogen is added (HfAl$_x$O$_y$N$_z$ (x>0, y>0, z>0)). By using a high-k material for the gate insulating layer 146, electrical characteristics can be ensured and the thickness can be made large to prevent gate leakage. Note that the gate insulating layer 146 may have a stacked structure of a film containing a high-k material and a film containing any of silicon oxide, silicon nitride, silicon oxynitride, silicon nitride oxide, aluminum oxide, and the like.

In addition, oxygen in the gate insulating layer 146 is preferably larger in proportion than the stoichiometric proportion. For example, when the gate insulating layer 146 is formed using gallium oxide, the composition can be represented by Ga$_2$O$_{3+\alpha}$ (0<α<1). In the case of using aluminum oxide, the stoichiometric composition can be Al$_2$O$_{3+\alpha}$ (0<α<1). In the case of using gallium aluminum oxide, the stoichiometric composition can be Ga$_x$Al$_{2-x}$O$_{3+\alpha}$ (0<x<2, 0<α<1).

Note that oxygen doping treatment may be performed after the oxide semiconductor layer is deposited, after the oxide semiconductor layer 144 is formed, or after the gate insulating layer 146 is formed. Oxygen doping means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, the term "oxygen doping" includes oxygen plasma doping by which oxygen plasma is added to a bulk. With oxygen doping, the proportion of oxygen included in the oxide semiconductor layer and the gate insulating layer can be made larger than the stoichiometric proportion.

The oxygen doping is preferably performed by an inductively coupled plasma (ICP) method, using oxygen plasma excited by a microwave (with a frequency of 2.45 GHz, for example).

Here, in order to satisfy Formula 1 or Formula 3, the insulating layer 128 and the gate insulating layer 146 preferably have the following thicknesses.

For example, in the case where the insulating layer 128 is formed using silicon oxide or silicon oxynitride and the gate insulating layer 146 is formed using silicon oxide or silicon oxynitride, it is preferable that the thickness $t_b$ of the insulating layer 128 be larger than or equal to 300 nm and the thickness $t_a$ of the gate insulating layer 146 be smaller than or equal to 30 nm. Note that the dielectric constant of silicon oxide and silicon oxynitride is approximately 4.

Alternatively, in the case where the insulating layer 128 is formed using silicon oxide or silicon oxynitride (with a dielectric constant of about 4) and the gate insulating layer 146 is formed using silicon nitride (with a dielectric constant of about 7), it is preferable that the thickness $t_b$ of the insulating layer 128 be larger than or equal to 180 nm and the thickness $t_a$ of the gate insulating layer 146 be smaller than or equal to 30 nm.

Further alternatively, in the case where the insulating layer 128 is formed using silicon oxide or silicon oxynitride (with a dielectric constant of about 4) and the gate insulating layer 146 is formed using hafnium oxide (with a dielectric constant of about 14), it is preferable that the thickness $t_b$ of the insulating layer 128 be larger than or equal to 90 nm and the thickness $t_a$ of the gate insulating layer 146 be smaller than or equal to 30 nm.

After the gate insulating layer 146 is formed, second heat treatment is preferably performed in an inert gas atmosphere or an oxygen atmosphere. The temperature of the heat treatment is set in the range of 200° C. to 450° C. inclusive, preferably 250° C. to 350° C. inclusive. For example, the heat treatment may be performed at 250° C. for 1 hour in a nitrogen atmosphere. The second heat treatment can reduce variation in electric characteristics of the transistor. In the case where the gate insulating layer 146 includes oxygen, oxygen can be supplied to the oxide semiconductor layer 144 to fill oxygen vacancies in the oxide semiconductor layer 144.

Note that in this embodiment, the second heat treatment is performed after the gate insulating layer 146 is formed; however, there is no particular limitation on the timing of the second heat treatment. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

As described above, by employing at least one of the first heat treatment and the second heat treatment, the oxide semiconductor layer 144 can be highly purified so as to contain the substance including a hydrogen atom as little as possible.

Figure 4D:
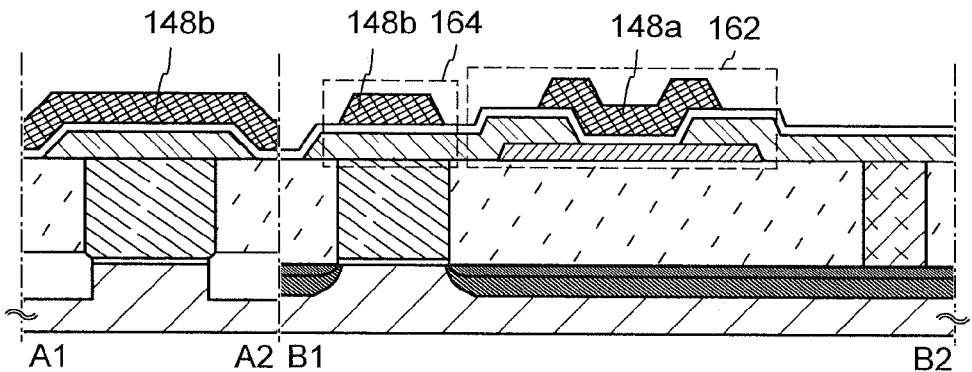

Next, a conductive layer for forming a gate electrode (as well as a wiring) is formed and is processed, so that a gate electrode 148a and a conductive layer 148b are formed (see FIG. 4D).

The gate electrode 148a and the conductive layer 148b can be formed using a metal material such as molybdenum, titanium, tantalum, tungsten, aluminum, copper, neodymium, or scandium or an alloy material containing any of these materials as its main component. Note that the gate electrode 148a and the conductive layer 148b may have a single-layer structure or a stacked structure.

Figure 5A:
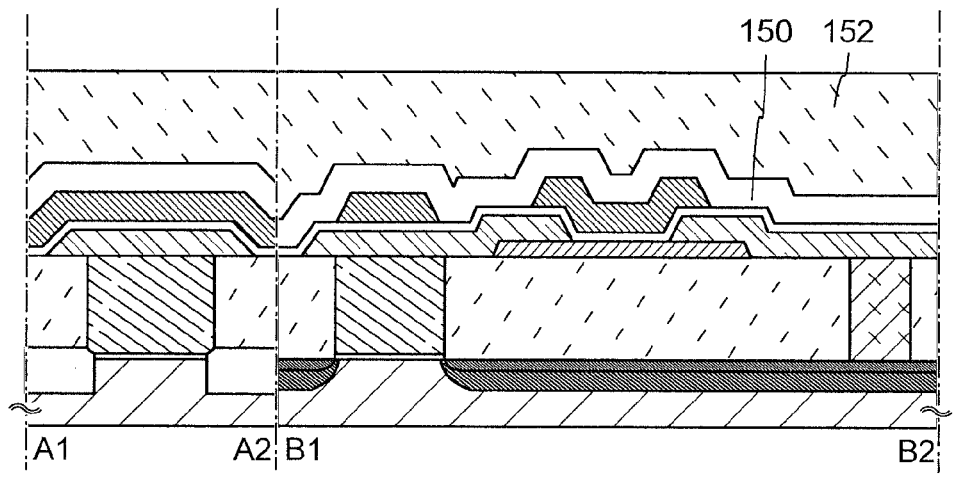
FIGS. 5A and 5B are cross-sectional views illustrating a process of manufacturing a semiconductor device.

Then, an insulating layer 150 and an insulating layer 152 are formed over the gate insulating layer 146, the gate electrode 148a, and the conductive layer 148b (see FIG. 5A). The insulating layer 150 and the insulating layer 152 can be formed by PVD, CVD, or the like. The insulating layer 150 and the insulating layer 152 can be formed using a material including an inorganic insulating material such as silicon oxide, silicon oxynitride, silicon nitride, hafnium oxide, gallium oxide, aluminum oxide, or gallium aluminum oxide. Note that for the insulating layers 150 and 152, a material with a low dielectric constant or a structure with a low dielectric constant (e.g., a porous structure) is preferably employed. This is because when the insulating layers 150 and 152 have a low dielectric constant, capacitance generated between wirings, electrodes, or the like can be reduced and operation at higher speed can be achieved. Note that although the insulating layers 150 and 152 have a single-layer structure in this embodiment, one embodiment of the present invention is not limited to this structure. The insulating layers 150 and 152 may have a stacked structure including two or more layers.

Next, an opening 153 reaching the source/drain electrode 142b is formed in the gate insulating layer 146, the insulating layer 150, and the insulating layer 152. Then, an electrode 154 that is in contact with the source/drain electrode 142b is formed over the insulating layer 152, and a wiring 156 that is in contact with the electrode 154 is formed over the insulating layer 152 (see FIG. 5B). The opening is formed by selective etching using a mask or the like.

The electrode 154 can be formed in such a manner that, for example, a conductive layer is formed by PVD, CVD, or the like in a region including the opening 153 and then part of the conductive layer is removed by etching, CMP, or the like.

Specifically, it is possible to employ a method, for example, in which a thin titanium film is formed by PVD in a region including the opening 153 and a thin titanium nitride film is formed by CVD, and then a tungsten film is formed so as to fill the opening 153. Here, the titanium film formed by PVD has a function of reducing an oxide film (e.g., a natural oxide film) formed on a surface where the titanium film is formed, thereby lowering the contact resistance with the lower electrode or the like (the source/drain electrode 142b, here). The titanium nitride film formed after the formation of the titanium film has a barrier function of preventing diffusion of the conductive material. A copper film may be formed by plating after the formation of the barrier film of titanium, titanium nitride, or the like.

Note that in the case where the electrode 154 is formed by removing part of the conductive layer, processing is preferably performed so that the surface is planarized. For example, when a thin titanium film or a thin titanium nitride film is formed in a region including the opening 153 and then a tungsten film is formed so as to fill the opening 153, excess tungsten, titanium, titanium nitride, or the like can be removed and the planarity of the surface can be improved by subsequent CMP treatment. The surface including the electrode 154 is planarized in such a manner, whereby favorable electrodes, wirings, insulating layers, semiconductor layers, and the like can be formed in later steps.

The wiring 156 can be formed by forming a conductive layer by PVD such as sputtering or CVD such as plasma CVD and patterning the conductive layer. As a material for the conductive layer, an element selected from aluminum, chromium, copper, tantalum, titanium, molybdenum, and tungsten; an alloy containing any of these elements as a component; or the like can be used. Further, one material selected from manganese, magnesium, zirconium, beryllium, neodymium, and scandium or a combined material of any of these materials may be used. The details are similar to those of the source/drain electrodes 142a and 142b, and the like.

Through the above steps, the transistor 162 and the capacitor 164 can be formed. The oxide semiconductor layer 144 used in the transistor 162 shown in this embodiment is preferably highly purified by sufficient removal of impurities such as hydrogen. For example, the concentration of hydrogen in the oxide semiconductor layer 144 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Oxygen vacancies in the oxide semiconductor layer 144 are preferably reduced by sufficient supply of oxygen. The carrier concentration of the oxide semiconductor layer 144, which is purified by a sufficient reduction in hydrogen concentration and is reduced in defect levels in the energy gap due to oxygen vacancies by sufficient supply of oxygen, is lower than $1 \times 10^{12}/\text{cm}^3$, preferably lower than $1 \times 10^{11}/\text{cm}^3$, further preferably lower than $1.45 \times 10^{10}/\text{cm}^3$. For example, the off-state current (here, per unit channel width (1 μm)) at room temperature (25° C.) is lower than or equal to 100 zA (1 zA (zeptoampere) is $1 \times 10^{-21}$ A), preferably lower than or equal to 10 zA. By using the purified oxide semiconductor layer 144 which becomes intrinsic (i-type) or substantially intrinsic, the transistor 162 with excellent off-current characteristics can be obtained.

Figure 5B:
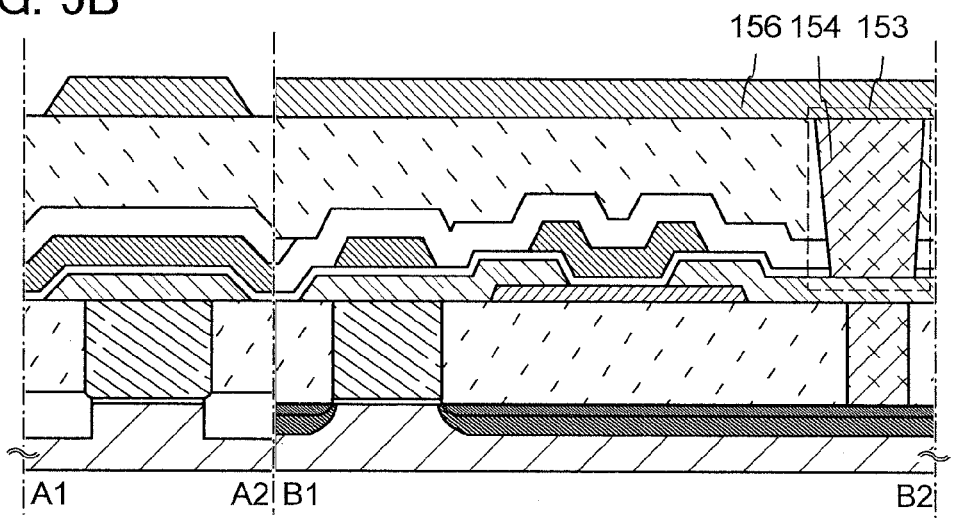

Through the above process, the semiconductor device including the transistor 160, the transistor 162, and the capacitor 164 is completed (see FIG. 5B).

The process of manufacturing the transistor including an oxide semiconductor layer does not need high-temperature treatment, so that the transistor including an oxide semiconductor layer can be formed without affecting another device such as the lower transistor and wirings. In addition, the number of steps for forming the transistor including an oxide semiconductor layer is smaller than that of steps for forming a transistor including a semiconductor material different from an oxide semiconductor (e.g., a transistor including silicon).

<Cross-Sectional View and Plan View of Semiconductor Device>

Figure 6A:
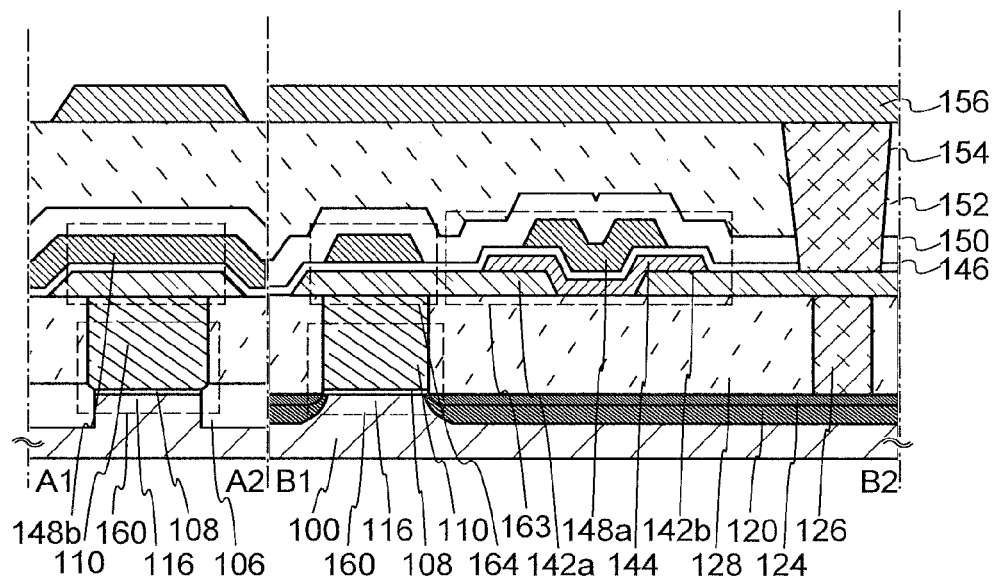
FIGS. 6A and 6B are a cross-sectional view and a plan view of a semiconductor device.
Figure 6B:
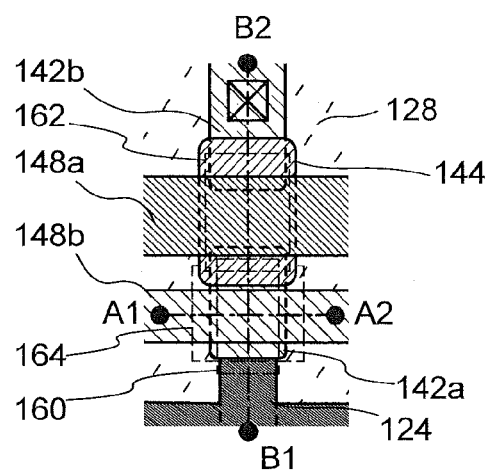

Next, a structure of a semiconductor device, part of which is different from that in FIGS. 1A and 1B, will be described with reference to FIGS. 6A and 6B. FIG. 6A is a cross-sectional view of the semiconductor device. FIG. 6B is a plan view of the semiconductor device. In FIG. 6A, the cross section A1-A2 is perpendicular to the channel length direction of a transistor, and the cross section B1-B2 is parallel to the channel length direction of the transistor. The semiconductor device illustrated in FIGS. 6A and 6B includes a transistor 160 including a first semiconductor material in a lower portion, and a transistor 163 including a second semiconductor material in an upper portion. The structures of the transistor 160 in the lower portion and the capacitor 164 in FIGS. 6A and 6B are similar to those in FIGS. 1A and 1B and thus is not described in detail.

The oxide semiconductor layer 144, the source/drain electrode 142a, the source/drain electrode 142b, the gate insulating layer 146, and the gate electrode 148a are included in both the transistor 163 illustrated in FIGS. 6A and 6B and the transistor 162 illustrated in FIGS. 1A and 1B. The difference between the transistor 163 and the transistor 162 is positions where the oxide semiconductor layer 144 is connected to the source/drain electrode 142a and the source/drain electrode 142b. That is, in the transistor 163, lower portions of the oxide semiconductor layer 144 are connected to the source/drain electrode 142a and the source/drain electrode 142b.

The methods, structures, and the like described in this embodiment can be combined as appropriate with any of the methods, structures, and the like described in the other embodiments.

<Circuit Configuration of Semiconductor Device>

Next, circuit configurations and operations of the semiconductor devices illustrated in FIGS. 1A and 1B and FIGS. 6A and 6B will be described with reference to FIGS. 7A-1, 7A-2, and 7B. Note that in circuit diagrams, "OS" is sometimes written beside a transistor in order to indicate that the transistor includes an oxide semiconductor.

<Basic Configuration>

In the semiconductor device in FIG. 7A-1, a first wiring (a 1st line) and a source electrode (or a drain electrode) of the transistor 160 are electrically connected to each other. A second wiring (a 2nd line) and the drain electrode (or the source electrode) of the transistor 160 are electrically connected to each other. A third wiring (a 3rd line) and a source electrode (or a drain electrode) of the transistor 162 are electrically connected to each other. A fourth wiring (a 4th line) and a gate electrode of the transistor 162 are electrically connected to each other. A gate electrode of the transistor 160 and the drain electrode (or the source electrode) of the transistor 162 are electrically connected to one electrode of the capacitor 164. A fifth wiring (a 5th line) and the other electrode of the capacitor 164 are electrically connected to each other. Note that the circuit configuration in FIG. 7A-1 corresponds to the configuration included in the semiconductor device in FIGS. 1A and 1B.

Here, the transistor 162 is the above-described transistor including an oxide semiconductor, for example. The transistor including an oxide semiconductor has a significantly low off-state current. For that reason, the potential of the gate electrode of the transistor 160 can be held for an extremely long time by turning off the transistor 162. The placement of the capacitor 164 facilitates retention of charge given to the gate electrode of the transistor 160 and reading of stored data. Alternatively, as the transistor including an oxide semiconductor, the transistor 163 illustrated in FIGS. 6A and 6B can be used instead of the transistor 162.

Note that there is no particular limitation on the transistor 160; a transistor including a semiconductor material which is not an oxide semiconductor is used as the transistor 160, for example. In terms of increasing the speed of reading data, it is preferable to use a transistor with high switching rate, such as a transistor formed using single crystal silicon, for example.

As illustrated in FIG. 7B, the capacitor 164 can be omitted from the structure illustrated in FIG. 7A-1.

The semiconductor device in FIG. 7A-1 utilizes the advantage that the potential of the gate electrode of the transistor 160 can be held, whereby writing, holding, and reading of data can be performed as described below.

Firstly, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is supplied to the gate electrode of the transistor 160 (writing). Here, one of charges for applying two different potentials (hereinafter, a charge for applying a low potential is referred to as a charge $Q_L$ and a charge for applying a high potential is referred to as a charge $Q_H$) is given to the gate electrode of the transistor 160. Note that charges for applying three or more different potentials may be supplied to increase the storage capacity. After that, the potential of the fourth wiring is set to a potential at which the transistor 162 is turned off, so that the transistor 162 is turned off. Thus, the charge given to the gate electrode of the transistor 160 is held (storing).

Since the off-state current of the transistor 162 is extremely low, the charge of the gate electrode of the transistor 160 is held for a long time.

However, in the case where the transistor 160 and the transistor 162 are provided to at least partly overlap with each other as shown in FIGS. 1A and 1B, a source region or a drain region of the transistor 160 might function as a backgate electrode of the transistor 162. When a positive potential is applied to the first wiring or the second wiring in the write operation, the threshold voltage of the transistor 162 is shifted negatively (shifted to normally-on side). Thus, the leakage current of the transistor 162 is increased, which might lead to deterioration of memory retention.

When Formula 1 or Formula 3 is satisfied, the source region or the drain region of the transistor 160 does not substantially function as a backgate electrode of the transistor 162. In other words, shift of the threshold voltage of the transistor 162 can be sufficiently suppressed. Thus, memory retention of the semiconductor device can be improved.

Secondly, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. This is because in general, in the case where the transistor 160 is an n-channel transistor, an apparent threshold voltage $V_{th\_H}$ when $Q_H$ is given to the gate electrode of the transistor 160 is lower than an apparent threshold voltage $V_{th\_L}$ when $Q_L$ is given to the gate electrode of the transistor 160. Here, an apparent threshold voltage refers to the potential of the fifth wiring, which is needed to turn on the transistor 160. Thus, when the potential of the fifth wiring is set to a potential $V_0$ intermediate between $V_{th\_H}$ and $V_{th\_L}$, charge given to the gate electrode of the transistor 160 can be distinguished. For example, in the case where $Q_H$ is given in the write operation, when the potential of the fifth wiring is set to $V_0$ ($>V_{th\_H}$), the transistor 160 is turned on. In the case where $Q_L$ is given in the write operation, the transistor 160 remains off even when the potential of the fifth wiring is set to $V_0$ ($<V_{th\_L}$). Therefore, the stored data can be read by measuring the potential of the second wiring.

However, in the case where the transistor 160 and the transistor 162 are provided to at least partly overlap with each other as shown in FIGS. 1A and 1B, the source region or the drain region of the transistor 160 might function as a backgate electrode of the transistor 162. That is, when a positive potential is applied to the first wiring or the second wiring in the read operation, the threshold voltage of the transistor 162 is shifted negatively (shifted to normally-on side). Thus, the leakage current of the transistor 162 is increased, which might lead to deterioration of retention characteristics.

When Formula 1 or Formula 3 is satisfied, the source region or the drain region of the transistor 160 does not substantially function as a backgate electrode of the transistor 162. In other words, shift of the threshold voltage of the transistor 162 can be sufficiently suppressed. Thus, memory retention of the semiconductor device can be improved.

Note that in the case where memory cells are arranged in array, it is necessary that data of only a desired memory cell can be read. In order that data of a predetermined memory cell is read and data of the other memory cells is not read, a potential at which the transistor 160 is off regardless of the state of the gate electrode of the transistor 160, that is, a potential lower than $V_{th\_H}$ is applied to fifth wirings of the memory cells that are not subjected to data reading. Alternatively, a potential at which the transistor 160 is on regardless of the state of the gate electrode of the transistor 160, that is, a potential higher than $V_{th\_L}$ is applied to the fifth wirings.

Thirdly, rewriting of data will be described. Rewriting of data is performed in a manner similar to that of the writing and holding of data. That is, the potential of the fourth wiring is set to a potential at which the transistor 162 is turned on, whereby the transistor 162 is turned on. Accordingly, the potential of the third wiring (a potential related to new data) is supplied to the gate electrode of the transistor 160 and the capacitor 164. After that, the potential of the fourth wiring is set to a potential at which the transistor 162 is turned off, whereby the transistor 162 is turned off. Accordingly, charge related to new data is given to the gate electrode of the transistor 160.

In the semiconductor device according to one embodiment of the present invention, data can be directly rewritten by another writing of data as described above. Therefore, extracting of charge from a floating gate with the use of high voltage needed in a flash memory or the like is not necessary and thus, reduction in operation speed, which is attributed to an erase operation, can be suppressed. In other words, high-speed operation of the semiconductor device can be realized.

Note that the drain electrode (or the source electrode) of the transistor 162 is electrically connected to the gate electrode of the transistor 160, and thereby has a function similar to that of a floating gate of a floating-gate transistor which is used as a non-volatile memory element. Therefore, a portion in the drawing where the source electrode (or the drain electrode) of the transistor 162 is electrically connected to the gate electrode of the transistor 160 is called a floating gate portion FG in some cases. When the transistor 162 is off, the floating gate portion FG can be regarded as being embedded in an insulator and thus charge is held in the floating gate portion FG. The amount of off-state current of the transistor 162 including an oxide semiconductor is smaller than or equal to one hundred thousandth of the amount of off-state current of a transistor including a silicon semiconductor and the like; therefore, lost of the charge accumulated in the floating gate portion FG due to the leakage current of the transistor 162 is negligible. That is, with the transistor 162 including an oxide semiconductor, a non-volatile storage device which can store data without supply of power can be realized.

For example, when the off-state current of the transistor 162 at room temperature (25° C.) is 10 zA (1 zA (zeptoampere) is $1 \times 10^{-21}$ A) or less and the capacitance of the capacitor 164 is approximately 10 fF, data can be stored at least for $10^4$ seconds. Needless to say, the retention time depends on transistor characteristics and the capacitance.

Further, in that case, the problem of deterioration of a gate insulating film (tunnel insulating film), which occurs in a conventional floating gate transistor, does not exist. That is, deterioration of a gate insulating film due to injection of an electron into a floating gate, which has been regarded as a problem, can be solved. This means that there is no fundamental limit on the write cycles. Furthermore, a high voltage needed for writing or erasing of data in a conventional floating gate transistor is not necessary.

Components such as transistors in the semiconductor device in FIG. 7A-1 can be regarded as including resistors and capacitors as illustrated in FIG. 7A-2. That is, in FIG. 7A-2, the transistor 160 and the capacitor 164 are each regarded as including a resistor and a capacitor. R1 and C1 denote the resistance and the capacitance of the capacitor 164, respectively. The resistance R1 corresponds to the resistance depending on the insulating layer included in the capacitor 164. R2 and C2 denote the resistance and the capacitance of the transistor 160, respectively. The resistance R2 corresponds to the resistance depending on the gate insulating layer at the time when the transistor 160 is on. The capacitance C2 corresponds to a gate capacitance (capacitance formed between the gate electrode and the source electrode or the drain electrode and capacitance formed between the gate electrode and the channel formation region).

The resistance (also referred to as effective resistance) between the source electrode and the drain electrode at the time when the transistor 162 is off is denoted by ROS. A charge retention period (also referred to as a data retention period) is determined mainly by the off-state current of the transistor 162 when R1≥ROS and R2≥ROS are satisfied under the condition that gate leakage of the transistor 162 is sufficiently small.

On the other hand, when the relations are not satisfied, it is difficult to secure a sufficient retention period even if the off-state current of the transistor 162 is low enough. This is because the leakage current other than the off-state current of the transistor 162 (e.g., a leakage current generated between the source electrode and the gate electrode) is large. Thus, it is preferable that the semiconductor device disclosed in this embodiment satisfy the above relations.

It is preferable that C1≥C2 be satisfied. This is because when C1 is large, the potential of the fifth wiring can be supplied to the floating gate portion FG efficiently at the time of controlling the potential of the floating gate portion FG by the fifth wiring, and a difference between potentials (e.g., the reading potential and a non-reading potential) supplied to the fifth wiring can be suppressed.

When the above relation is satisfied, a more preferable semiconductor device can be realized. Note that R1 and R2 are controlled by the gate insulating layer of the transistor 160 and the insulating layer of the capacitor 164. The same relation applies to C1 and C2. Therefore, the material, the thickness, and the like of the gate insulating layer are preferably set as appropriate to satisfy the above relation.

In the semiconductor device described in this embodiment, the floating gate portion FG has a function similar to that of a floating gate of a floating gate transistor in a flash memory or the like, but the floating gate portion FG of this embodiment has a feature which is essentially different from that of the floating gate in a flash memory or the like. In a flash memory, since a voltage applied to a control gate is high, it is necessary to keep a proper distance between cells in order to prevent the potential from affecting a floating gate of the adjacent cell. This is one of inhibiting factors for high integration of the semiconductor device. The factor is attributed to a basic principle of a flash memory, in which a tunneling current is generated by application of a high electrical field.

In contrast, the semiconductor device according to this embodiment is operated by switching of a transistor including an oxide semiconductor and does not use the above-described principle of charge injection by tunneling current. That is, unlike a flash memory, a high electrical field for charge injection is not necessary. Accordingly, it is not necessary to consider an influence of a high electrical field from a control gate on an adjacent cell, which facilitates high integration.

In addition, the semiconductor device according to this embodiment has advantages over a flash memory in that a high electric field is unnecessary and a large peripheral circuit (such as a booster circuit) is unnecessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where data of two levels (one bit) is written.

In the case where the dielectric constant $\in$r1 of the insulating layer included in the capacitor 164 is different from the dielectric constant $\in$r2 of the insulating layer included in the transistor 160, it is easy to satisfy C1≥C2 while 2·S2≥S1 (preferably, S2≥S1) is satisfied where S1 is the area of the insulating layer included in the capacitor 164 and S2 is the area of the insulating layer included in the transistor 160. In other words, C1 can easily be made greater than or equal to C2 while the area of the insulating layer in the capacitor 164 is made small. Specifically, for example, a film formed of a high-k material such as hafnium oxide or a stack of a film formed of a high-k material such as hafnium oxide and a film formed of an oxide semiconductor is used for the insulating layer in the capacitor 164 so that $\in$r1 can be set to 10 or more, preferably 15 or more, and silicon oxide is used for the insulating layer in the transistor 160 so that $\in$r2 can be set to greater than or equal to 3 and less than or equal to 4.

A combination of such structures enables higher integration of the semiconductor device according to one embodiment of the present invention.

Note that in order to increase the storage capacity of the semiconductor device, a multilevel technique can be employed in addition to the increase in the degree of integration. For example, data of three or more levels is written into one memory cell, whereby the storage capacity can be increased as compared to the case where data of two levels is written. The multilevel technique can be achieved by, for example, giving charge Q for supplying another potential to the gate electrode of the transistor in addition to the charge $Q_L$ for supplying a high potential and the charge $Q_H$ for supplying a low potential. In that case, enough storage capacity can be secured even when a circuit configuration in which $F^2$ is not sufficiently small is employed.

Note that an n-channel transistor (n-type transistor) using electrons as carriers is used in the above description; it is needless to say that a p-channel transistor using holes as carriers can be used instead of an n-channel transistor.

As described above, the semiconductor device according to this embodiment is suitable for increasing the degree of integration. A semiconductor device with higher integration degree can be provided by sharing of wirings and reduction in contact area according to this embodiment.

The methods, structures, and the like described in this embodiment can be combined as appropriate with any of the methods, structures, and the like described in the other embodiments.

(Embodiment 2)

In this embodiment, an application example of a semiconductor device according to one embodiment of the present invention will be described with reference to FIGS. 8A to 8C and FIGS. 9A to 9C. Here, an example of a storage device will be described. Note that in circuit diagrams, "OS" is sometimes written beside a transistor in order to indicate that the transistor includes an oxide semiconductor.

Figure 8A:
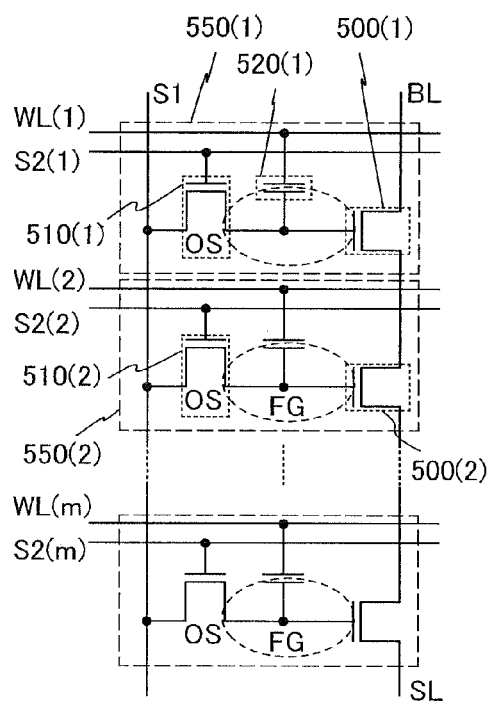
FIGS. 8A to 8C are circuit diagrams of semiconductor devices.
Figure 8B:
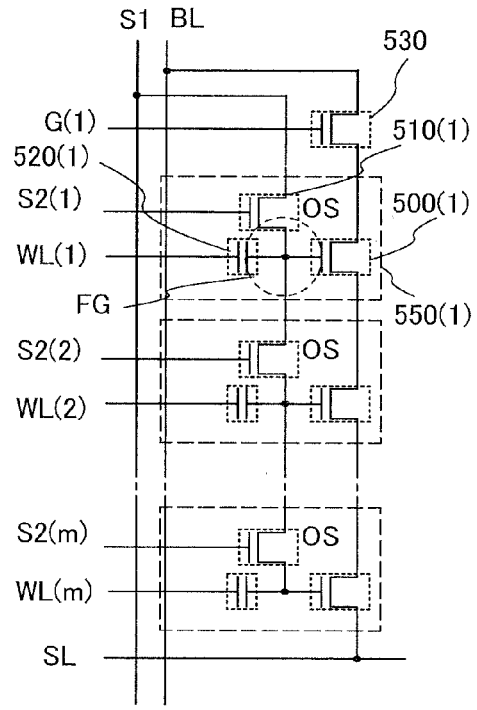
Figure 8C:
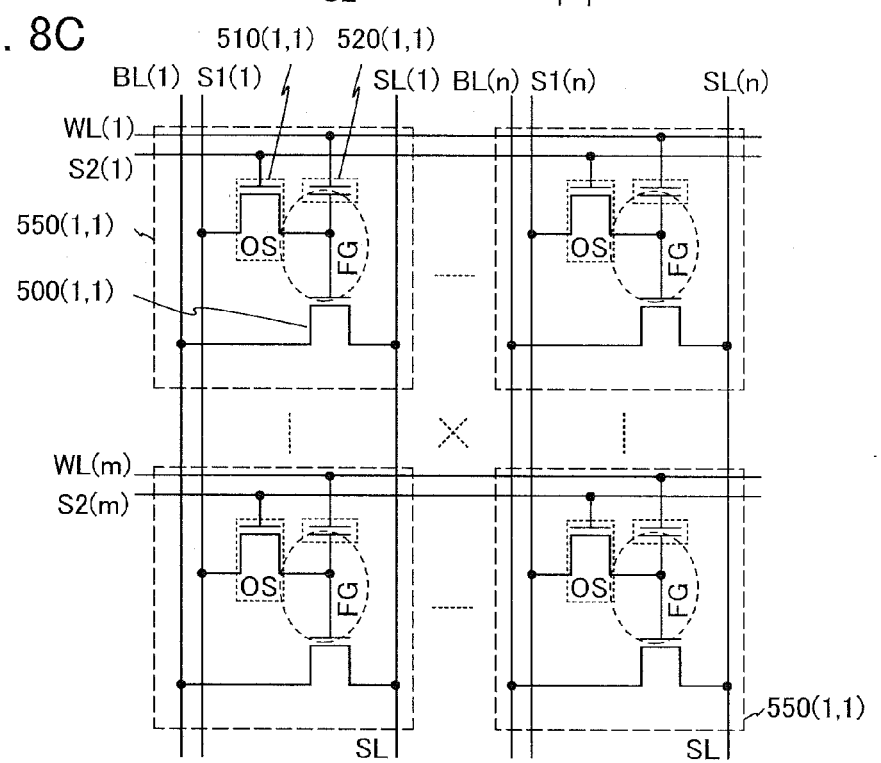

FIGS. 8A to 8C are circuit diagrams of semiconductor devices each of which can be used as a storage device and includes a plurality of semiconductor devices (hereinafter also referred to as memory cells) illustrated in FIG. 7A-1. Each of FIGS. 8A and 8B is a circuit diagram of a NAND semiconductor device in which memory cells are connected in series. FIG. 8C is a circuit diagram of a NOR semiconductor device in which memory cells are connected in parallel.

The semiconductor device in FIG. 8A includes a source line SL, a bit line BL, a first signal line S1, m second signal lines S2, m word lines WL, and m memory cells. In FIG. 8A, one source line SL and one bit line BL are provided in the semiconductor device; however, this embodiment is not limited to this structure. A plurality of source lines SL and a plurality of bit lines BL may be provided.

A memory cell 550(i) is considered as a typical example of the memory cells, where i is an integer of greater than or equal to 1 and less than or equal to m. In the memory cell 550(i), a gate electrode of a transistor 500(i), a drain electrode (or a source electrode) of a transistor 510(i), and one electrode of a capacitor 520(i) are electrically connected to each other. The first signal line 51 and the source electrode (or the drain electrode) of the transistor 510(i) are electrically connected to each other. The second signal line S2 and the gate electrode of the transistor 510(i) are electrically connected to each other. The word line WL and the other electrode of the capacitor 520(i) are electrically connected to each other.

Further, the source electrode of the transistor 500(i) included in the memory cell 550(i) is electrically connected to a drain electrode of a transistor 500(i−1) in an adjacent memory cell 550(i−1). The drain electrode of the transistor 500(i) included in the memory cell 550(i) is electrically connected to a source electrode of a transistor 500(i+1) in an adjacent memory cell 550(i+1). Note that a drain electrode of a transistor 500(1) included in a memory cell 550(1) among the m memory cells connected in series is electrically connected to the bit line BL. In addition, the source electrode of the transistor 500(m) included in the memory cell 550(m) among the m memory cells connected in series is electrically connected to the source line SL.

The transistor 500(1) in the memory cell 550(1) may be electrically connected to the bit line BL through a selection transistor (not illustrated). In that case, a selection line G(1) is connected to a gate electrode of the selection transistor. Further, the transistor 500(m) in the memory cell 550(m) may be electrically connected to the source line SL through a selection transistor (not illustrated). In that case, a selection line G(2) is connected to a gate electrode of the selection transistor.

In the semiconductor device in FIG. 8A, a write operation and a read operation per row are performed. The write operation is performed as follows. A potential at which the transistor 510(i) is turned on is supplied to the second signal line S2(i) in a row subjected to data writing (e.g., in the memory cells 550(i,1) to (i,n) in the i-th row), so that the transistor 510(i) in the row subjected to data writing is turned on. Accordingly, the potential of the second signal line S2(i) is supplied to the gate electrode of the transistor 500(i) of the specified row, so that predetermined charge is given to the gate electrode. Thus, data can be written into the memory cell of the specified row.

The read operation is performed as follows. First, the selection transistor is turned on by supply of a potential to the selection line G(1) and the selection line G(2). Moreover, word lines WL of rows other than the row subjected to data reading (e.g., the i-th row) are supplied with a potential at which the transistors 500 that are not in the row subjected to data reading are turned on regardless of charge given to the gate electrode of the transistor 500(i), so that the transistors 500 in the rows other than the row subjected to data reading are turned on. Then, the word line WL(i) of the row subjected to data reading is supplied with a potential (reading potential) at which the on state or the off state of the transistor 500(i) is selected depending on data to which the charge stored in the gate electrode of the transistor 500(i) corresponds. Moreover, a constant potential is supplied to the source line SL so that a reading circuit (not illustrated) connected to the bit line BL operates. Here, among a plurality of transistors 500(1) to 500(m) between the source line SL and the bit line BL, all the transistors 500 except the transistor 500(i) in the row subjected to data reading is on; therefore, the level of the conductance between the source line SL and the bit line BL is determined by the state (the on state or the off state) of the transistor 500(i) in the row subjected to data reading. The state (the on state or the off state) of the transistor 500(i) differs depending on data to which the charge stored in the gate electrode of the transistor 500(i) in the row subjected to data reading corresponds; thus, the potential of the bit line BL varies accordingly. By reading the potential of the bit line BL with the reading circuit, data can be read out from the memory cell of the specified row.

FIG. 8B illustrates a semiconductor device whose configuration is partly different from that in FIG. 8A.

One of differences between the semiconductor device in FIG. 8B and the semiconductor device in FIG. 8A is that the bit line BL and the drain electrode of the transistor 500(1) in the memory cell 550(1) are electrically connected to each other through a selection transistor 530 in the semiconductor device in FIG. 8B. A gate electrode of the selection transistor 530 is electrically connected to the selection line G(1) for switching between the on and off states of the selection transistor 530. Furthermore, the source line SL and the drain electrode of the transistor 500(m) in the memory cell 550(m) may be electrically connected to each other through a selection transistor whose gate electrode is electrically connected to the selection line G(2).

Another difference between the semiconductor device in FIG. 8B and the semiconductor device in FIG. 8A is that the source electrode (or the drain electrode) of the transistor 510 in each memory cell is connected to the first signal line S1 in the semiconductor device in FIG. 8A, whereas the transistors 510 in the memory cells are connected in series in the semiconductor device in FIG. 8B. That is, the source electrode of the transistor 500(i) in the memory cell 550(i) is electrically connected to a drain electrode of a transistor 500(i−1) in an adjacent memory cell 550(i−1). The drain electrode of the transistor 500(i) in the memory cell 550(i) is electrically connected to a source electrode of a transistor 500(i+1) in an adjacent memory cell 550(i+1). Note that the source electrode of the transistor 500(1) in the memory cell 550(1) among the m memory cells connected in series is electrically connected to the first signal line S1. Moreover, in the memory cells connected in series, the drain electrode (or the source electrode) of the transistor 510(i) is electrically connected to the gate electrode of the transistor 510(i) and one electrode of the capacitor 520(i) as in the semiconductor device in FIG. 8A.

The configuration of other portions of the semiconductor device in FIG. 8B is similar to that of the semiconductor device in FIG. 8A; therefore, the above description can be referred to for the details.

Note that the first signal line S1 and the bit line BL are separately provided in the semiconductor device in FIG. 8B; however, the disclosed invention is not limited to this structure. The first signal line S1 and the bit line BL may be one line.

Also in the semiconductor device in FIG. 8B, a write operation and a read operation per row are performed. The write operation is performed as follows.

The write operation is sequentially performed every row from the m-th row. In order to perform data writing on the i-th row (i is 1 to m), a potential at which the transistor 510(i) is turned on is supplied to the second signal line S2(i) in the row subjected to data writing (the i-th row), so that the transistor 510(i) in the row subjected to data writing is turned on. Here, in the case where the transistors 510(1) to 510(i−1) exist between the transistor 510(i) and the first signal line S1, the transistors 510(1) to 510(i−1) in the rows that precede the row subjected to data writing are turned on so that the potential of the first signal line S1 is applied to the memory cell 550(i) in the row subjected to data writing. Accordingly, the potential of the second signal line S2(i) is supplied to the gate electrode of the transistor 500(i) of the specified row, so that predetermined charge is given to the gate electrode. Then, the potential of the second signal line S2(i) is fixed at GND, so that charge accumulated in the gate electrode of the transistor 500(i) is retained. Thus, data can be written into the memory cell of the specified row (the i-th row).

Note that in the semiconductor device in FIG. 8B, since the transistors 510 included in the memory cells 550 are connected in series, it is difficult to rewrite data only in a given row. Therefore, an operation for erasing data in a plurality of rows at once is preferably performed. For example, an erase operation per block is preferably performed, dividing the first to m-th rows into blocks. In order to rewrite data in a predetermined block, it is preferable that data in the block be erased first, and then data writing be sequentially performed from the m-th row. Note that in the case where data in a row on which data writing has just been performed is rewritten, an erase operation is unnecessary.

The read operation is performed as follows. First, the selection transistor is turned on by supply of a potential to the selection line G(1). Note that in the case where there are the selection transistor connected to the selection line G(1) and the selection transistor connected to the selection line G(2), the two transistors are turned on. Moreover, word lines WL of rows other than the row subjected to data reading (e.g., the i-th row) are supplied with a potential at which the transistors 500 that are not in the row subjected to data reading are turned on regardless of charge given to the gate electrode of the transistor 500(i), so that the transistors 500 in the rows other than the row subjected to data reading are turned on. Then, the word line WL(i) of the row subjected to data reading is supplied with a potential (reading potential) at which the on state or the off state of the transistor 500(i) is selected depending on data to which the charge stored in the gate electrode of the transistor 500(i) corresponds. Moreover, a constant potential is supplied to the source line SL so that a reading circuit (not illustrated) connected to the bit line BL operates. Here, among a plurality of transistors 500(1) to 500(m) between the source line SL and the bit line BL, all the transistors 500 except the transistor 500(i) of the row subjected to data reading is on; therefore, the level of the conductance between the source line SL and the bit line BL is determined by the state (the on state or the off state) of the transistor 500(i) in the row subjected to data reading. The state (the on state or the off state) of the transistor 500(i) differs depending on data to which the charge stored in the gate electrode of the transistor 500(i) in the row subjected to data reading corresponds; thus, the potential of the bit line BL varies accordingly. By reading the potential of the bit line BL with the reading circuit, data can be read out from the memory cell of the specified row.

The semiconductor device in FIG. 8C includes n source lines SL, n bit lines BL, n first signal lines S1, m second signal lines S2, m word lines WL, and a plurality of memory cells 550(1,1) to 550(m,n).

A memory cell 550(i,j) is considered as a typical example of the memory cells, where i is an integer of 1 to m and j is an integer of 1 to n. In the memory cell 550(i,j), a gate electrode of a transistor 500(i,j), a drain electrode (or a source electrode) of a transistor 510(i,j), and one electrode of a capacitor 520(i,j) are electrically connected to each other. The source line SL(j) and a source electrode of the transistor 500(i,j) are electrically connected to each other. The bit line BL(j) and a drain electrode of the transistor 500(i,j) are electrically connected to each other. The first signal line 51(j) and the source electrode (or the drain electrode) of the transistor 510(i,j) are electrically connected to each other. The second signal line S2(i) and the gate electrode of the transistor 510(i,j) are electrically connected to each other. The word line WL(i) and the other electrode of the capacitor 520(i,j) are electrically connected to each other.

In the semiconductor device in FIG. 8C, a write operation and a read operation per row are performed. The write operation is performed in the same manner as that in the semiconductor device in FIG. 8A. The read operation is performed as follows. First, word lines WL of rows other than the row subjected to data reading (e.g., the i-th row) are supplied with a potential at which the transistors 500 that are not in the row subjected to data reading are turned off regardless of data to which the charge given to the gate electrodes of the transistors 500(i,1) to 500(i,n) corresponds; thus, the transistors 500 in the rows other than the row subjected to data reading are turned off. Then, the word line WL(i) of the row subjected to data reading is supplied with a potential (reading potential) at which the on state or the off state of the transistors 500(i,1) to 500(i,n) is selected depending on data to which the charge stored in the gate electrodes of the transistors 500(i,1) to 500(i,n) corresponds. Moreover, a constant potential is supplied to the source line SL(j) so that a reading circuit (not illustrated) connected to the bit line BL(j) operates. Here, the level of the conductance between the source line SL(j) and the bit line BL(j) is determined by the state (the on state or the off state) of the transistors 500(i,1) to 500(i,n) in the row subjected to data reading. That is, the potential of the bit line BL(j) differs depending on data to which the charge stored in the gate electrodes of the transistors 500(i,1) to 500(i,n) in the row subjected to data reading corresponds. By reading the potential of the bit line BL(j) with the reading circuit, data can be read out from the memory cell of the specified row.

Although the amount of data stored in each of the memory cells 550 is one bit in the above description, the structure of the semiconductor device in this embodiment is not limited to this example. The amount of data stored in each memory cell 550 may be increased by preparation of three or more potentials to be supplied to the gate electrode of the transistor 500 at the time of data writing. For example, in the case where four kinds of potentials are supplied to the gate electrode of the transistor 500 at the time of data writing, data of two bits can be held in each of the memory cells.

In FIGS. 8A to 8C, the first signal line S1 and the bit line BL may be one line. When one line serves as both the first signal line S1 and the bit line BL, the number of wirings can be reduced. Further, in FIG. 8C, the source signal line SL may be shared with some or all of the memory cells.

Next, an example of a reading circuit that can be used for the semiconductor devices illustrated in FIGS. 8A to 8C and the like will be described with reference to FIGS. 9A to 9C.

Figure 9A:
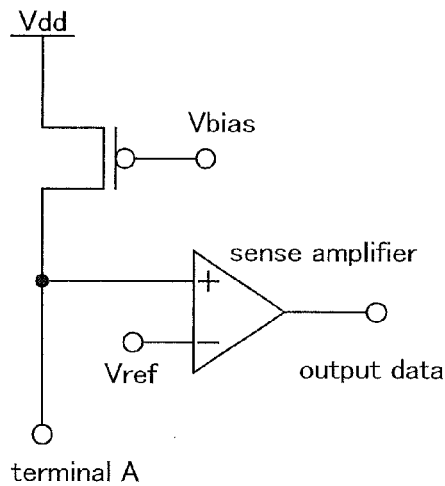
FIGS. 9A to 9C are circuit diagrams of a semiconductor device.

FIG. 9A illustrates a schematic of the reading circuit. The reading circuit includes a transistor and a sense amplifier circuit.

At the time of reading data, a terminal A is connected to a bit line BL to which a memory cell subjected to data reading is connected. Further, a bias potential Vbias is applied to a gate electrode of the transistor so that a current flowing through the transistor is controlled.

The load connected to the terminal A of the reading circuit is decided by the level of the conductance between the source line SL and the bit line BL. The level of the conductance between the source line SL and the bit line BL is decided by the state (the on state or the off state) of the transistor 500 in a memory cell subjected to data reading. That is, the level of the conductance between the source line SL and the bit line BL differs depending on data to which the charge stored in the gate electrode of the transistor 500 in the memory cell subjected to data reading corresponds.

When the transistor 500 in the memory cell subjected to data reading is on, the conductance between the source line SL and the bit line BL is increased, and the potential of the terminal A becomes lower than a reference potential Vref. As a result, the sense amplifier circuit outputs a signal Low. When the transistor 500 in the memory cell subjected to data reading is off, the conductance between the source line SL and the bit line BL is reduced, and the potential of the terminal A becomes higher than the reference potential Vref. As a result, the sense amplifier circuit outputs a signal High.

In such a manner, data can be read from the memory cell by using the reading circuit. Note that the reading circuit of this embodiment is one example. For example, a reference bit line BL may be connected to the sense amplifier circuit instead of the reference potential Vref. Alternatively, the bit line BL may be precharged in advance, and the potential of the terminal A, which is decided by whether the precharged charge is discharged or not, may be read out. Whether the precharged charge is discharged depends on the level of the conductance between the source line SL and the bit line BL. In that case, a current source such as the transistor illustrated in FIG. 9A is not necessarily provided. Further, the reading circuit may include a precharge circuit.

Figure 9B:
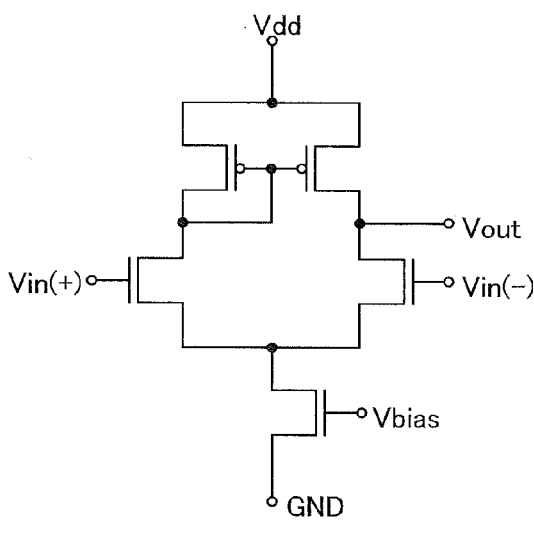

FIG. 9B illustrates a differential sense amplifier which is an example of sense amplifier circuits. The differential sense amplifier has input terminals Vin(+) and Vin(−) and an output terminal Vout, and amplifies the difference between Vin(+) and Vin(−). In most cases, the output from Vout is a signal High when Vin(+)>Vin(−), and is a signal Low when Vin(+)

<Vin(−). In the case where the differential sense amplifier is used for the reading circuit, one of Vin(+) and Vin(−) is connected to the terminal A, and the reference potential Vref is supplied to the other of Vin(+) and Vin(−).

Figure 9C:
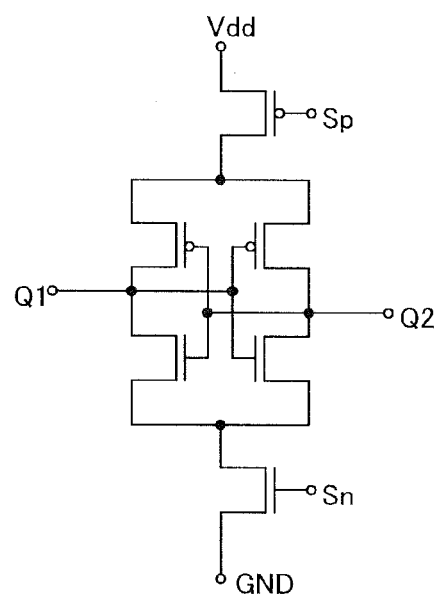

FIG. 9C illustrates a latch sense amplifier which is an example of sense amplifier circuits. The latch sense amplifier has a node Q1, a node Q2, and input terminals for control signals Sp and Sn. First, the signal Sp is set to High and the signal Sn is set to Low, whereby a power supply potential (Vdd) is interrupted. Then, potentials V1in and V2in for comparison are supplied to the node Q1 and the node Q2, respectively. After that, the node Q1 and the node Q2 are brought into a floating state. Then, the signal Sp is set to Low and the signal Sn is set to High, whereby the power supply potential is supplied. Thus, the node Q1 is set to High and the node Q2 is set to Low when V1in>V2in, and the node Q1 is set to Low and the node Q2 is set to High when V1in<V2in. Then, a signal is output by establishing electrical continuity between the node Q1 or the node Q2 and the output terminal. In the case where the latch sense amplifier is used for the reading circuit, the node Q1 and the terminal A are connected through a switch and the node Q2 and the reference potential Vref are connected through a switch, for example. Moreover, the node Q1 and the output terminal are connected through a switch.

The methods, structures, and the like described in this embodiment can be combined as appropriate with any of the methods structures, and the like described in the other embodiments.

(Embodiment 3)

In this embodiment, application of the semiconductor device described in any of the above embodiments to an electronic device will be described with reference to FIGS. 10A to 10F. In this embodiment, examples of the electronic device to which the above semiconductor device is applied are a computer, a mobile phone (also referred to as a cell phone or a mobile phone device), a personal digital assistant (including a portable game machine and an audio reproducing device), a camera such as a digital camera and a digital video camera, electronic paper, and a television device (also referred to as a television or a television receiver).

Figure 10A:
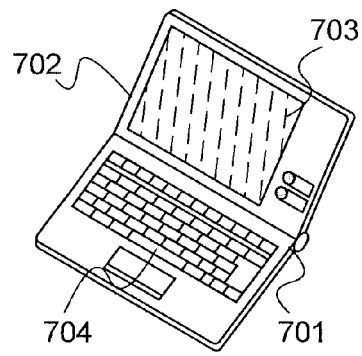
FIGS. 10A to 10F each illustrate an electronic device including a semiconductor device.

FIG. 10A illustrates a laptop personal computer that includes a housing 701, a housing 702, a display portion 703, a keyboard 704, and the like. The semiconductor device described in the above embodiment is provided in at least one of the housing 701 and the housing 702. Thus, it is possible to realize a laptop personal computer in which data is written and read at high speed, data can be retained for a long time, and power consumption is sufficiently low.

Figure 10D:
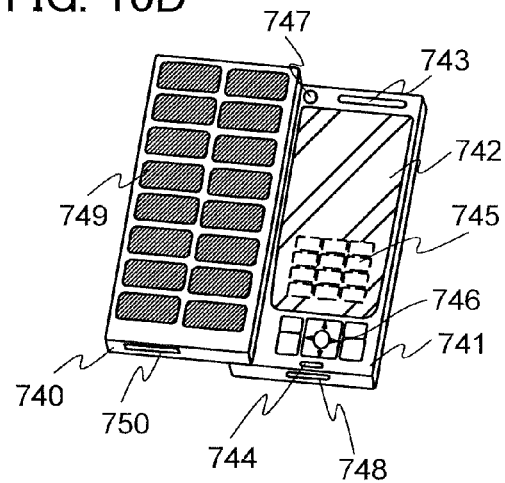
Figure 10B:
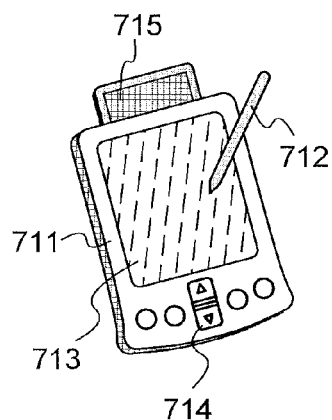

FIG. 10B illustrates a personal digital assistant (PDA). A main body 711 is provided with a display portion 713, an external interface 715, operation buttons 714, and the like. Further, a stylus 712 or the like for operating the personal digital assistant is provided. The semiconductor device described in the above embodiment is provided in the main body 711. Thus, it is possible to realize a personal digital assistant in which data is written and read at high speed, data can be retained for a long time, and power consumption is sufficiently low.

Figure 10E:
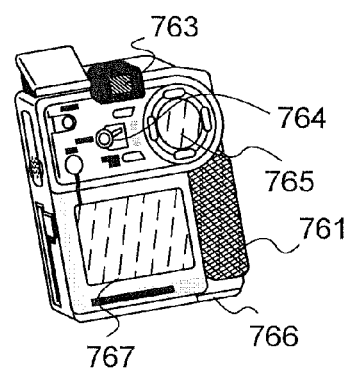
Figure 10C:
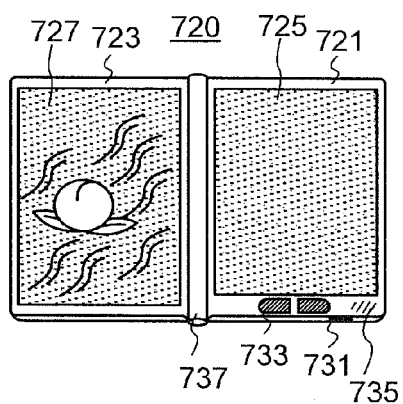

FIG. 10C illustrates an e-book reader 720 including electronic paper, and the e-book reader 720 includes two housings of a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, and the like. At least one of the housings 721 and 723 is provided with the semiconductor device described in the above embodiment. Thus, it is possible to realize an e-book reader in which data is written and read at high speed, data can be retained for a long time, and power consumption is sufficiently low.

FIG. 10D illustrates a mobile phone including two housings of a housing 740 and a housing 741. The housing 740 and the housing 741 developed as illustrated in FIG. 10D can shift by sliding so that one is lapped over the other; therefore, the size of the mobile phone can be reduced, which makes the mobile phone suitable for being carried. The housing 741 is provided with a display panel 742, a speaker 743, a microphone 744, an operation key 745, a pointing device 746, a camera lens 747, an external connection terminal 748, and the like. The housing 740 is provided with a solar cell 749 for charging the mobile phone, an external memory slot 750, and the like. An antenna is incorporated in the housing 741. At least one of the housings 740 and 741 is provided with the semiconductor device described in the above embodiment. Thus, it is possible to realize a mobile phone in which data is written and read at high speed, data can be retained for a long time, and power consumption is sufficiently low.

FIG. 10E illustrates a digital camera including a main body 761, a display portion 767, an eyepiece 763, an operation switch 764, a display portion 765, a battery 766, and the like. The semiconductor device described in the above embodiment is provided in the main body 761. Thus, it is possible to realize a digital camera in which data is written and read at high speed, data can be retained for a long time, and power consumption is sufficiently low.

Figure 10F:
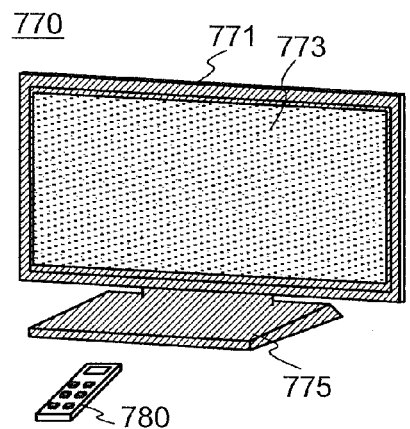

FIG. 10F illustrates a television device 770 including a housing 771, a display portion 773, a stand 775, and the like. The television device 770 can be operated with an operation switch of the housing 771 or a remote controller 780. The housing 771 and the remote controller 780 are each provided with the semiconductor device described in the above embodiment. Thus, it is possible to realize a television device in which data is written and read at high speed, data can be retained for a long time, and power consumption is sufficiently low.

As described above, the electronic devices described in this embodiment each include the semiconductor device described in any of the above embodiments; thus, electronic devices with low power consumption can be realized.

Explanation Of Reference

100: substrate, 102: protective layer, 104: semiconductor region, 106: element isolation insulating layer, 108: gate insulating layer, 110: gate electrode, 116: channel formation region, 120: impurity region, 122: metal layer, 124: metal compound region, 126: electrode, 128: insulating layer, 142$a$: source/drain electrode, 142$b$: source/drain electrode, 144: oxide semiconductor layer, 146: gate insulating layer, 148: gate electrode, 148$a$: gate electrode, 148$b$: conductive layer, 150: insulating layer, 152: insulating layer 153: opening, 154: electrode, 156: wiring, 160: transistor, 162: transistor, 163: transistor, 164: capacitor, 500: transistor, 510: transistor, 520: capacitor, 530: transistor, 550: memory cell, 701: housing, 702: housing, 703: display portion, 704: keyboard, 711: main body, 712: stylus, 713: display portion, 714: operation button, 715: external interface, 720: e-book reader, 721: housing, 723: housing, 725: display portion, 727: display portion, 731: power switch, 733: operation key 735: speaker, 737: hinge portion, 740: housing, 741: housing, 742: display panel, 743: speaker, 744: microphone, 745: operation key, 746: pointing device, 747: camera lens, 748: external connection terminal, 749: solar cell, 750: external memory slot, 761: main body, 763: eyepiece, 764: operation switch, 765: display portion, 766: battery, 767: display portion, 770: television device, 771: housing, 773: display portion, 775: stand, 780: remote controller This application is based on Japanese Patent Application serial No. 2010-162184 filed with Japan Patent Office on Jul. 16, 2010, the entire contents of which are hereby incorporated by reference.

The invention claimed is:

1. A semiconductor device comprising:
a first transistor;
an insulating layer over one of a source region and a drain region of the first transistor; and
a second transistor including:
a channel formation region over the insulating layer;
a gate insulating layer over the channel formation region; and
a gate electrode over the gate insulating layer,
wherein a top surface of a gate electrode of the first transistor is in contact with a bottom surface of one of a source electrode and a drain electrode of the second transistor,
wherein the gate insulating layer of the second transistor and the insulating layer satisfy a formula:

$$\frac{t_a}{t_b} \cdot \frac{\varepsilon_{rb}}{\varepsilon_{ra}} < 0.1$$

wherein $t_a$ represents a thickness of the gate insulating layer of the second transistor, $t_b$ represents a thickness of the insulating layer, $\varepsilon_{ra}$ represents a dielectric constant of the gate insulating layer of the second transistor, and $\varepsilon_{rb}$ represents a dielectric constant of the insulating layer.

2. The semiconductor device according to claim 1, wherein the top surface of the gate electrode of the first transistor is exposed when the insulating layer is formed by chemical mechanical polishing.

3. The semiconductor device according to claim 1, wherein the channel formation region of the second transistor comprises an In—Ga—Zn—O-based oxide semiconductor.

4. The semiconductor device according to claim 1, wherein an off-state current per 1 μm of a channel width of the second transistor is lower than 100 zA/μm 25 ° C.

5. The semiconductor device according to claim 1, wherein a memory cell comprises the first transistor and the second transistor.

6. The semiconductor device according to claim 1, wherein the gate insulating layer of the second transistor comprises oxygen in proportion than the stoichiometric proportion.

7. The semiconductor device according to claim 1,
wherein the thickness of the gate insulating layer of the second transistor $t_a$ is smaller than or equal to 30 nm, and
wherein the thickness of the insulating layer $t_b$ is larger than or equal to 90 nm.

8. A semiconductor device comprising:
a first transistor;
an insulating layer over one of a source region and a drain region of the first transistor; and
a second transistor including:
a channel formation region over the insulating layer;
a gate insulating layer over the channel formation region; and
a gate electrode over the gate insulating layer,
wherein a level of a top surface of a gate electrode of the first transistor is substantially the same as a level of a top surface of the insulating layer,
wherein the gate electrode of the first transistor is electrically connected to one of a source electrode and a drain electrode of the second transistor,
wherein the gate insulating layer of the second transistor and the insulating layer satisfy a formula:

$$\frac{t_a}{t_b} \cdot \frac{\varepsilon_{rb}}{\varepsilon_{ra}} < 0.1$$

wherein $t_a$ represents a thickness of the gate insulating layer of the second transistor, $t_b$ represents a thickness of the insulating layer, $\varepsilon_{ra}$ represents a dielectric constant of the gate insulating layer of the second transistor, and $\varepsilon_{rb}$ represents a dielectric constant of the insulating layer.

9. The semiconductor device according to claim 8, wherein the top surface of the gate electrode of the first transistor is exposed when the insulating layer is formed by chemical mechanical polishing.

10. The semiconductor device according to claim 8, wherein the channel formation region of the second transistor comprises an In—Ga—Zn—O-based oxide semiconductor.

11. The semiconductor device according to claim 8, wherein an off-state current per 1 μm of a channel width of the second transistor is lower than 100 zA/μm at 25° C.

12. The semiconductor device according to claim 8, wherein a memory cell comprises the first transistor and the second transistor.

13. The semiconductor device according to claim 8, wherein the gate insulating layer of the second transistor comprises oxygen in proportion than the stoichiometric proportion.

14. The semiconductor device according to claim 8,
wherein the thickness of the gate insulating layer of the second transistor $t_a$ is smaller than or equal to 30 nm, and
wherein the thickness of the insulating layer $t_b$ is larger than or equal to 90 nm.

15. A semiconductor device comprising:
a first transistor;
an insulating layer over one of a source region and a drain region of the first transistor; and
a second transistor including:
a channel formation region over the insulating layer;
a gate insulating layer over the channel formation region; and
a gate electrode over the gate insulating layer,
wherein a top surface of a gate electrode of the first transistor is in contact with a bottom surface of one of a source electrode and a drain electrode of the second transistor,
wherein a channel formation region of the first transistor comprises silicon,
wherein the channel formation region of the second transistor comprises an oxide semiconductor,
wherein the gate insulating layer of the second transistor and the insulating layer satisfy a formula:

$$\frac{t_a}{t_b} \cdot \frac{\varepsilon_{rb}}{\varepsilon_{ra}} < 0.1$$

wherein $t_a$ represents a thickness of the gate insulating layer of the second transistor, $t_b$ represents a thickness of the insulating layer, $\in_{ra}$ represents a dielectric constant of the gate insulating layer of the second transistor, and $\in_{rb}$ represents a dielectric constant of the insulating layer.

16. The semiconductor device according to claim 15, wherein the top surface of the gate electrode of the first transistor is exposed when the insulating layer is formed by chemical mechanical polishing.

17. The semiconductor device according to claim 15, wherein the oxide semiconductor is an In—Ga—Zn—O-based oxide semiconductor.

18. The semiconductor device according to claim 15, wherein an off-state current per 1 μm of a channel width of the second transistor is lower than 100 zA/μm at 25° C.

19. The semiconductor device according to claim 15, wherein a memory cell comprises the first transistor and the second transistor.

20. The semiconductor device according to claim 15, wherein the gate insulating layer of the second transistor comprises oxygen in proportion than the stoichiometric proportion.

21. The semiconductor device according to claim 15,
wherein the thickness of the gate insulating layer of the second transistor $t_a$ is smaller than or equal to 30 nm, and
wherein the thickness of the insulating layer $t_b$ is larger than or equal to 90 nm.

\* \* \* \* \*

UNITED STATES PATENT AND TRADEMARK OFFICE
CERTIFICATE OF CORRECTION

PATENT NO.         : 8,847,326 B2                                    Page 1 of 1
APPLICATION NO.    : 13/913591
DATED              : September 30, 2014
INVENTOR(S)        : Yamazaki et al.

It is certified that error appears in the above-identified patent and that said Letters Patent is hereby corrected as shown below:

In the Specification

Column 26, line 43 – replace "51" with --S1--;

Column 29, line 35 – replace "51($j$)" with --S1($j$)--; and

In the Claims

Column 33, line 47, claim 4 – after "zA/μm" insert --at--.

Signed and Sealed this
Sixteenth Day of June, 2015

Michelle K. Lee
*Director of the United States Patent and Trademark Office*